(12) United States Patent
Chae et al.

(10) Patent No.: US 11,489,036 B2
(45) Date of Patent: Nov. 1, 2022

(54) DISPLAY PANEL INCLUDING COMPONENT AREA HAVING FIRST AREA, AND SECOND AREA SURROUNDING FIRST AREA AND DISPLAY DEVICE INCLUDING THE SAME

(71) Applicant: Samsung Display Co., Ltd., Yongin-si (KR)

(72) Inventors: Jongwon Chae, Yongin-si (KR); Moosoon Ko, Yongin-si (KR); Sunghoon Moon, Yongin-si (KR); Sewan Son, Yongin-si (KR); Yongje Jeon, Yongin-si (KR); Jingoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 17/075,550

(22) Filed: Oct. 20, 2020

(65) Prior Publication Data

US 2021/0134932 A1 May 6, 2021

(30) Foreign Application Priority Data

Oct. 30, 2019 (KR) .......................... 10-2019-0136892

(51) Int. Cl.
*H01L 29/08* (2006.01)
*H01L 27/32* (2006.01)

(52) U.S. Cl.
CPC ...... *H01L 27/3276* (2013.01); *H01L 27/3262* (2013.01); *H01L 27/3265* (2013.01)

(58) Field of Classification Search
CPC ............. H01L 27/3276; H01L 27/3262; H01L 27/3265

(Continued)

(56) References Cited

U.S. PATENT DOCUMENTS 9,490,312 B2   11/2016   Lee et al.
10,109,704 B2  10/2018   Shin et al.
(Continued)

FOREIGN PATENT DOCUMENTS

CN   109585519 A   4/2019
CN   109979391 A   7/2019
(Continued)

OTHER PUBLICATIONS

EPO Extended European Search Report dated Mar. 25, 2021, issued in corresponding European Patent Application No. 20203946.7 (9 pages).

*Primary Examiner* — Phuc T Dang
(74) *Attorney, Agent, or Firm* — Lewis Roca Rothgerber Christie LLP

(57) ABSTRACT

A display panel includes: a substrate including a component area, and a display area surrounding the component area, the component area including a first area, and a second area surrounding the first area; a plurality of first display elements at the display area; a plurality of pixel groups spaced from each other in an island shape at the first area, each of the plurality of pixel groups including a plurality of second display elements; a plurality of transmission areas adjacent to the plurality of pixel groups at the first area; and a plurality of first wirings extending in a first direction and electrically connected to the plurality of first display elements, the plurality of first wirings detouring around the first area at the second area.

23 Claims, 14 Drawing Sheets

(58) Field of Classification Search
USPC .......................................................... 257/40
See application file for complete search history.

(56) References Cited

U.S. PATENT DOCUMENTS

| | | | |
|---|---|---|---|
| 10,431,604 B2 | 10/2019 | Cho et al. | |
| 10,756,136 B1 | 8/2020 | Ma et al. | |
| 2007/0109472 A1* | 5/2007 | Chuang | G02F 1/133555 |
| | | | 349/114 |
| 2013/0224897 A1* | 8/2013 | Ishioka | H01L 27/14627 |
| | | | 438/70 |
| 2019/0023455 A1* | 1/2019 | Adachi | B31B 70/813 |
| 2019/0130822 A1 | 5/2019 | Jung et al. | |
| 2019/0148672 A1* | 5/2019 | Seo | H01L 27/3234 |
| | | | 257/40 |
| 2021/0013298 A1 | 1/2021 | Her et al. | |

FOREIGN PATENT DOCUMENTS

| | | |
|---|---|---|
| CN | 110061014 A | 7/2019 |
| KR | 10-2017-0113066 A | 10/2017 |
| KR | 10-2017-0114029 A | 10/2017 |
| KR | 10-2018-0125061 A | 11/2018 |
| WO | 2019/199139 A1 | 10/2019 |

\* cited by examiner

DISPLAY PANEL INCLUDING COMPONENT AREA HAVING FIRST AREA, AND SECOND AREA SURROUNDING FIRST AREA AND DISPLAY DEVICE INCLUDING THE SAME

CROSS-REFERENCE TO RELATED APPLICATION

This application claims priority to and the benefit of Korean Patent Application No. 10-2019-0136892, filed on Oct. 30, 2019, in the Korean Intellectual Property Office, the entire disclosure of which is incorporated by reference herein.

BACKGROUND

1. Field

Aspects of one or more embodiments relate to a display panel and a display device including the same, and more particularly, to a display panel in which a display area is extended such that an image may be expressed even at (e.g., in or on) an area in which a component is arranged, and a display device including the display panel.

2. Description of Related Art

Recently, purposes of display devices have been diversifying. In addition, as display devices have become thinner and more lightweight, their range of use has gradually been extended.

As display devices are used in various ways, their shapes may be designed in various ways. Also, functions that may be combined or associated with display devices are increasing.

The above information disclosed in this Background section is for enhancement of understanding of the background of the present disclosure, and therefore, it may contain information that does not constitute prior art

SUMMARY

One or more example embodiments of the present disclosure are directed to a display device including a first area at (e.g., in or on) which a component, for example, such as a sensor, a camera, and/or the like, may be arranged inside a display area, such that functions that may be combined or associated with the display device may be increased.

However, the present disclosure is not limited to the aspects and features described above, and additional aspects and features will be set forth in part in the description that follows, and in part, will become apparent from the description, or may be learned by practicing one or more example embodiments of the present disclosure.

According to one or more example embodiments of the present disclosure, a display panel includes: a substrate including a component area, and a display area surrounding the component area, the component area including a first area, and a second area surrounding the first area; a plurality of first display elements at the display area; a plurality of pixel groups spaced from each other in an island shape at the first area, each of the plurality of pixel groups including a plurality of second display elements; a plurality of transmission areas adjacent to the plurality of pixel groups at the first area; and a plurality of first wirings extending in a first direction and electrically connected to the plurality of first display elements, the plurality of first wirings detouring around the first area at the second area.

In an example embodiment, a resolution of the component area per unit area may be ½ or less than a resolution of the display area per unit area.

In an example embodiment, the display panel may further include a plurality of second wirings extending in the first direction and electrically connected to the plurality of second display elements, the plurality of second wirings overlapping with at least a portion of the plurality of transmission areas.

In an example embodiment, the plurality of second wirings overlapping with the at least the portion of the plurality of transmission areas may be biased on one side of the plurality of transmission areas.

In an example embodiment, the plurality of first wirings and the plurality of second wirings may be configured to transfer a data signal to the plurality of first display elements and the plurality of second display elements.

In an example embodiment, the display panel may further include a plurality of third wirings extending in a second direction crossing the first direction, and detouring along an edge of the first area.

In an example embodiment, the plurality of third wirings may be configured to transfer a scan signal to the plurality of first display elements.

In an example embodiment, the display panel may further include: a first conductive layer on the substrate; a second conductive layer on the first conductive layer; a first insulating layer between the first conductive layer and the second conductive layer; and a plurality of second wirings extending in the first direction and electrically connected to the plurality of second display elements, the plurality of second wirings overlapping with at least a portion of the plurality of transmission areas. The plurality of second wirings may include the same material as that of the first conductive layer.

In an example embodiment, each of the plurality of first wirings may include an extension portion at the display area, and a detouring portion at the second area, and the extension portion may be connected to the detouring portion through a contact hole defined in the first insulating layer.

In an example embodiment, the extension portion may include the same material as that of the first conductive layer, and the detouring portion may include the same material as that of the second conductive layer.

In an example embodiment, each of the plurality of second display elements may be electrically connected to a pixel circuit including a thin film transistor and a storage capacitor, the thin film transistor may include a semiconductor layer, a gate electrode overlapping with the semiconductor layer, and an electrode layer connected to the semiconductor layer, and the storage capacitor may include a bottom electrode, and a top electrode overlapping with the bottom electrode, the gate electrode of the thin film transistor serving as the bottom electrode of the storage capacitor.

In an example embodiment, the first conductive layer may include the same material as that of the electrode layer.

In an example embodiment, each of the plurality of second display elements may include: a pixel electrode; an opposite electrode on the pixel electrode; and an intermediate layer between the pixel electrode and the opposite electrode, and the pixel circuit may further include a contact metal layer connected to the electrode layer at a bottom portion thereof, and connected to the pixel electrode at a top portion thereof.

In an example embodiment, the second conductive layer may include the same material as that of the contact metal layer.

In an example embodiment, some of the plurality of pixel groups may be surrounded by the plurality of transmission areas.

In an example embodiment, some of the plurality of pixel groups may be surrounded by the plurality of transmission areas and the second area.

In an example embodiment, the display panel may further include at least one insulating layer on the substrate, and the at least one insulating layer may have openings corresponding to the plurality of transmission areas, respectively.

In an example embodiment, some of the plurality of first wirings may detour around at least some of the plurality of pixel groups, and may overlap with some of the plurality of transmission areas.

In an example embodiment, a transmittance of the plurality of transmission areas may be greater than a transmittance of the second area.

In an example embodiment, the display panel may further include a plurality of metal layers at the component area, and the plurality of metal layers may correspond to the plurality of pixel groups, respectively.

In an example embodiment, each of the plurality of second display elements may be electrically connected to a thin film transistor including a semiconductor layer, and a gate electrode overlapping with the semiconductor layer, and the plurality of metal layers may be located between the substrate and the semiconductor layer.

According to one or more example embodiments of the present disclosure, a display device includes: a display panel including a substrate, the substrate including a component area, and a display area surrounding the component area, and the component area including a first area, and a second area surrounding the first area; and an electronic element at the component area of the display panel. The display panel includes: a plurality of first display elements at the display area; a plurality of pixel groups spaced from each other in an island shape at the first area, each of the plurality of pixel groups including a plurality of second display elements; a plurality of transmission areas adjacent to the plurality of pixel groups at the first area; and a plurality of first wirings extending in a first direction and electrically connected to the plurality of first display elements, the plurality of first wirings detouring around the first area at the second area.

In an example embodiment, the electronic element may include an imaging element.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
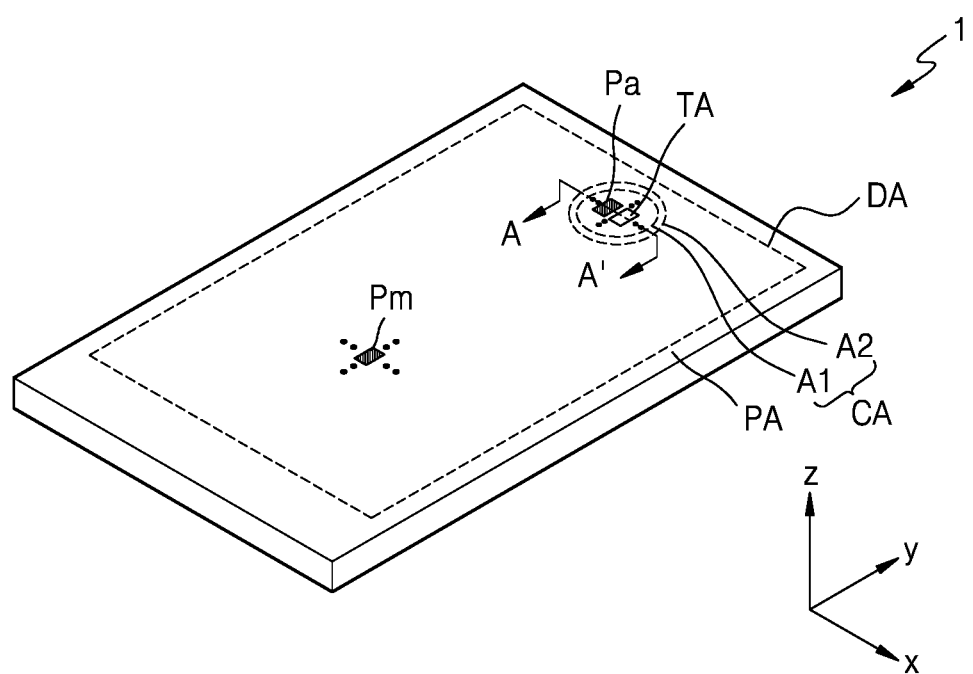
FIG. 1 is a perspective view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, or component, for example, such as a film, an area, a plate, and/or the like, is referred to as being "on," "connected to," or "coupled to" another element, layer, or component, it can be directly on, connected to, or coupled to the other element, layer, or component, or one or more intervening elements, layers, or components may be present. In addition, it will also be understood that when an element, layer, or component is referred to as being "between" two elements, layers, or components, it can be the only element, layer, or component between the two elements, layers, or components, or one or more intervening elements, layers, or components may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 1 according to an embodiment.

Referring to FIG. 1, the display device 1 includes a component area CA, a display area DA, and a peripheral area PA. The display area DA may at least partially surround (e.g., around a periphery of) the component area CA, and the peripheral area PA may be outside the display area DA. For example, in an embodiment, the peripheral area PA may at least partially surround (e.g., around a periphery of) the display area DA. The display device 1 may provide an image (e.g., a predetermined image) by using light emitted from a plurality of pixels arranged at (e.g., in or on) the display area DA and the component area CA. In an embodiment, as shown in FIG. 1, one component area CA may be arranged within (e.g., inside) the display area DA. However, the present disclosure is not limited thereto, and in another embodiment, the number of component areas CA may be two or more, and the shapes and/or the sizes of the component areas CA provided in a plurality may be the same or substantially the same as each other or may be different from each other. The peripheral area PA may define (e.g., may be a kind of) a non-display area at (e.g., in or on) which pixels are not arranged. In an embodiment, the display area DA may be entirely surrounded (e.g., around a periphery thereof) by the peripheral area PA.

Hereinafter, the display device 1 according to an embodiment may be described as an organic light-emitting display device as an example. However, the present disclosure is not limited thereto. For example, in other embodiments, the display device 1 may be various suitable kinds of display devices, for example, such as an inorganic light-emitting display device, a quantum dot light-emitting display device, and/or the like. For example, in various embodiments, an emission layer of a display element of the display device 1 may include an organic material, an inorganic material, quantum dots, an organic material and quantum dots, an inorganic material and quantum dots, and/or the like.

Although FIG. 1 shows that the component area CA may have a circular shape or an approximate circular shape in a plan view (e.g., in a view from a direction perpendicular to or substantially perpendicular to a main surface of a substrate), the present disclosure is not limited thereto. For example, in other embodiments, the shape of the component area (e.g., of each component area) CA in a plan view may be variously modified to any suitable shape, such as a polygon shape, for example, including a quadrangle shape, a star shape, a diamond shape, and/or the like, a circle shape, an ellipse shape, and/or the like.

While FIG. 1 shows that the component area CA may be arranged at (e.g., in or on) a center or central area of one side (e.g., an upper side) of the display area DA, which may have a quadrangular shape in a plan view, the present disclosure is not limited thereto. For example, in other embodiments, when the display area DA has a quadrangular shape in a plan view, the component area CA may be arranged at (e.g., in or on) an upper right side, an upper left side, a center or central area of a lower side, a lower right side, a lower left side, a right side, a left side, and/or the like of the display area DA. Further, the shape of the display area DA is not limited to the quadrangular shape in a plan view, and the display area DA may have any suitable shape in a plan view, for example, such as another polygon shape (e.g., a square, a diamond, a pentagon, a start, and/or the like), a circle shape, an ellipse shape, and/or the like.

The display device 1 may provide a main image by using light emitted from a plurality of main pixels Pm arranged at (e.g., in or on) the display area DA.

The display device 1 includes the component area CA within (e.g., inside) the display area DA. As described in more detail below with reference to FIG. 2, the component area CA may be an area in which a component, for example, such as a sensor and/or an imaging element, is arranged therebelow. For example, the sensor may use a visible ray or sound, and the imaging element may include a camera. The component area CA may include (e.g., may be) a transmission area TA through which light that is output from the component towards the outside and/or through which light that propagates towards the component from the outside, may be transmitted (e.g., may pass). In an embodiment, in the case where an infrared ray passes through the component area CA, a transmittance of the component area CA may be 10% (e.g., about 10%) or more. For example, in various embodiments, the transmittance of the component area CA may be 20% (e.g., about 20%) or more, 25% (e.g., about 25%) or more, 50% (e.g., about 50%) or more, 85% (e.g., about 85%) or more, or 90% (e.g., about 90%) or more.

In the embodiment shown in FIG. 1, a plurality of auxiliary pixels Pa may be arranged at (e.g., in or on) the component area CA. The display device 1 may provide an image (e.g., a predetermined image) by using light emitted from the plurality of auxiliary pixels Pa. An image provided from the component area CA may be an auxiliary image, and a resolution of the auxiliary image may be less than that of an image provided from the display area DA. In other words, the component area CA may include a transmission area TA through which light and/or sound may be transmitted (e.g., may be passed). In some embodiments, the pixels (e.g., the auxiliary pixels Pa) may not be arranged at (e.g., in or on) the transmission area TA. Because the pixels may not be arranged at (e.g., in or on) the transmission area TA, the number of auxiliary pixels Pa that may be arranged per a unit area at (e.g., in or on) the component area CA may be less than the number of main pixels Pm that may be arranged per the unit area at (e.g., in or on) the display area DA.

The component area CA may include a first area A1 and a second area A2. The first area A1 may generally refer to a central portion (e.g., a central area) of the component area CA, and the second area A2 may generally refer to an edge portion (e.g., a periphery portion) of the component area CA. The second area A2 may be an area that at least partially surrounds (e.g., around a periphery of) the first area A1. The plurality of auxiliary pixels Pa and the transmission area TA may be located at (e.g., in or on) the first area A1.

Figure 2:
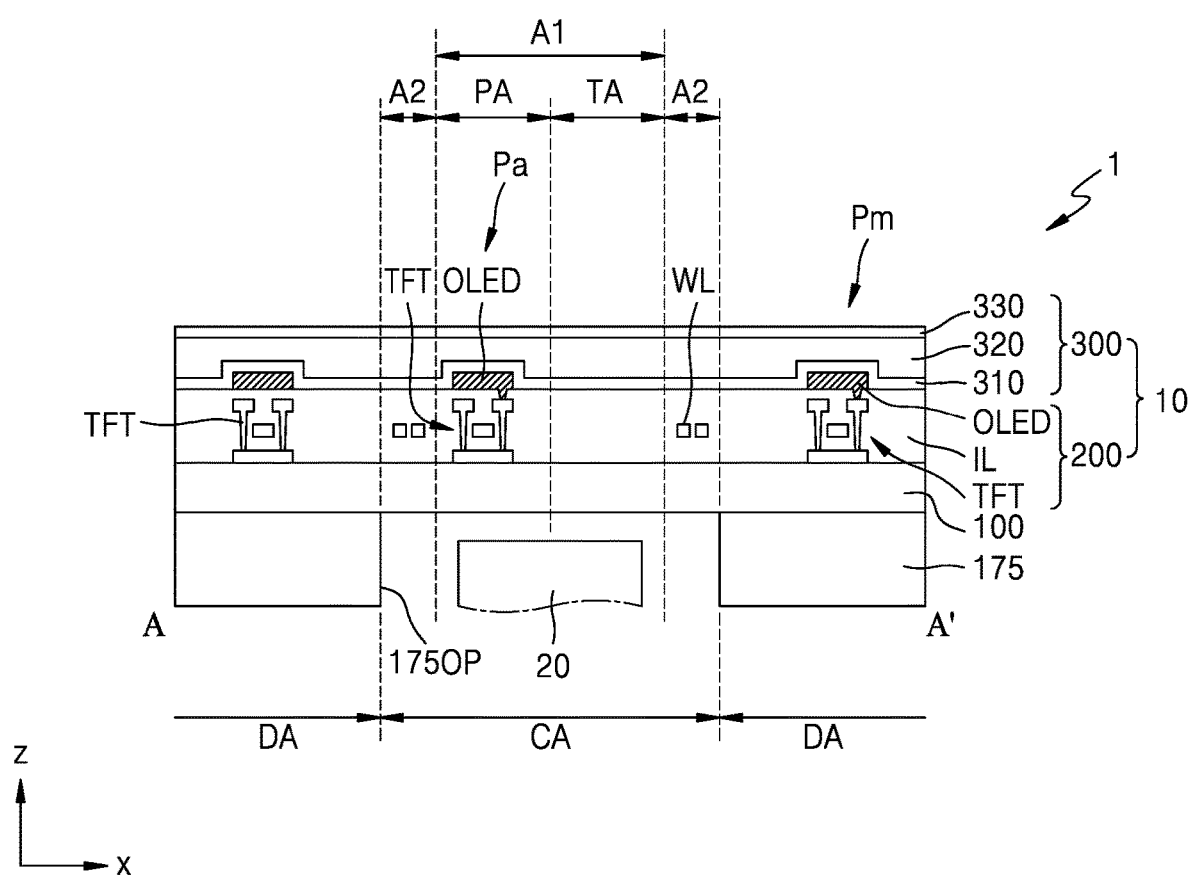
FIG. 2 is a cross-sectional view of a display device according to an embodiment.

FIG. 2 is a cross-sectional view of the display device 1 according to an embodiment. FIG. 2 may correspond to a cross-section of the display device 1 taken along the line A-A' of FIG. 1.

Referring to FIG. 2, the display device 1 may include a display panel 10 including a display element (e.g., an OLED), and an electronic element 20 (which may also be referred to as a component) located below the display panel 10 and corresponding to the component area CA.

The display panel 10 may include a substrate 100, a display element layer 200 arranged on the substrate 100, and a thin-film encapsulation layer 300 to seal the display element layer 200 as a sealing member. The display panel 10 may further include a bottom protective film 175 arranged under (e.g., underneath) the substrate 100.

The substrate 100 may include glass or a polymer resin. In an embodiment, the substrate 100 may include a polymer resin, for example, such as polyethersulfone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 including the polymer resin may be flexible, rollable, and/or bendable. The substrate 100 may have a multi-layered structure including, for example, a layer including the polymer resin, and an inorganic layer.

The display element layer 200 may include a circuit layer, an organic light-emitting diode OLED as the display element, and an insulating layer IL therebetween. The circuit layer may include a thin film transistor TFT.

A main pixel Pm is arranged at (e.g., in or on) the display area DA. The main pixel Pm may include a thin film transistor TFT, and an organic light-emitting diode OLED connected to the thin film transistor TFT. Further, wirings (e.g., scan lines, data lines, emission control lines, power lines, and/or the like) may be arranged at (e.g., in or on) the display area DA, and may be electrically connected to the main pixel Pm and/or the auxiliary pixel Pa.

The auxiliary pixel Pa may be arranged at (e.g., in or on) the component area CA. The auxiliary pixel Pa may include a thin film transistor TFT, and an organic light-emitting diode OLED connected to the thin film transistor TFT. The component area CA may include the first area A1, and the second area A2 that at least partially surrounds (e.g., around a periphery of) the first area A1. The auxiliary pixel Pa may be located at (e.g., in or on) the first area A1. The second area A2 may be an area at (e.g., in or on) which wirings WL that extend around (e.g., that detour around) the first area A1 may be arranged.

The transmission area TA, at (e.g., in or on) which a thin film transistor TFT and a pixel are not arranged, may be arranged at (e.g., in or on) the component area CA. The transmission area TA may be an area through which light/signal emitted from the electronic element 20, and/or light/signal incident to the electronic element 20 transmits (e.g., passes).

The electronic element 20 may be located at (e.g., in or on) the component area CA. The electronic element 20 may be an electronic component or device that uses light and/or sound. For example, the electronic element 20 may be an imaging element such as a camera, a sensor such as an infrared sensor that emits and/or receives light, a sensor that outputs and senses light and/or sound to measure a distance or to recognize a fingerprint, a lamp (e.g., a small lamp) that outputs light, a speaker that outputs sound, and/or the like. An electronic element that uses light may use various wavelength bands of light, for example, such as visible light, infrared light, and ultraviolet light. The electronic element 20 arranged at (e.g., in or on) the component area CA may be provided as a single electronic element or a plurality of electronic elements. For example, a light-emitting element and a light-receiving element may be provided (e.g., may be provided together) as a plurality of electronic elements 20 at (e.g., in or on) one or more component areas CA. In another example, one electronic element 20 may include a light emitter and a light receiver concurrently (e.g., simultaneously or at the same time) as a single electronic element 20.

The thin-film encapsulation layer 300 may include at least one inorganic encapsulation layer and at least one organic encapsulation layer. For example, FIG. 2 shows that the thin-film encapsulation layer 300 may include first and second inorganic encapsulation layers 310 and 330, and an organic encapsulation layer 320 therebetween.

The first and second inorganic encapsulation layers 310 and 330 may include at least one inorganic insulating material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include, for example, polyethylene terephthalate, polyethylene naphthalate, polycarbonate, polyimide, polyethylene sulfonate, polyoxymethylene, polyarylate, hexamethyldisiloxane, an acrylic resin (e.g. polymethyl methacrylate, a polyacrylic acid, and/or the like), or any suitable combination thereof.

The bottom protective film 175 may be attached under (e.g., underneath) the substrate 100 to support and protect the substrate 100. The bottom protective film 175 may include an opening 175OP corresponding to the component area CA. Because the opening 175OP may be provided in the bottom protective film 175, a light transmittance of the component area CA may be improved. The bottom protective film 175 may include polyethylene terephthalate or polyimide.

An area (e.g., a size) of the component area CA may be greater than an area at (e.g., in or on) which the electronic element 20 is arranged. Although it is shown in FIG. 2 that the area (e.g., the size) of the component area CA is equal or substantially equal to an area (e.g., a size) of the opening 175OP, the present disclosure is not limited thereto, and the area of the opening 175OP provided in the bottom protective film 175 may not be equal or substantially equal to the area of the component area CA. For example, in another embodiment, the area of the opening 175OP may be less than the area of the component area CA.

In some embodiments, various elements, for example, such as an input sensing member for sensing a touch input, a reflection prevention member (e.g., including a polarizer, a retarder, a color filter, a black matrix, and/or the like), a transparent window, and/or the like, may be further arranged on the display panel 10.

While FIG. 2 shows that the thin-film encapsulation layer 300 may be used as an encapsulation member for sealing the display element layer 200, the present disclosure is not limited thereto. For example, a sealing substrate that is attached to the substrate 100 by using a sealant or a frit may be used as a member for sealing the display element layer 200.

Figure 3:
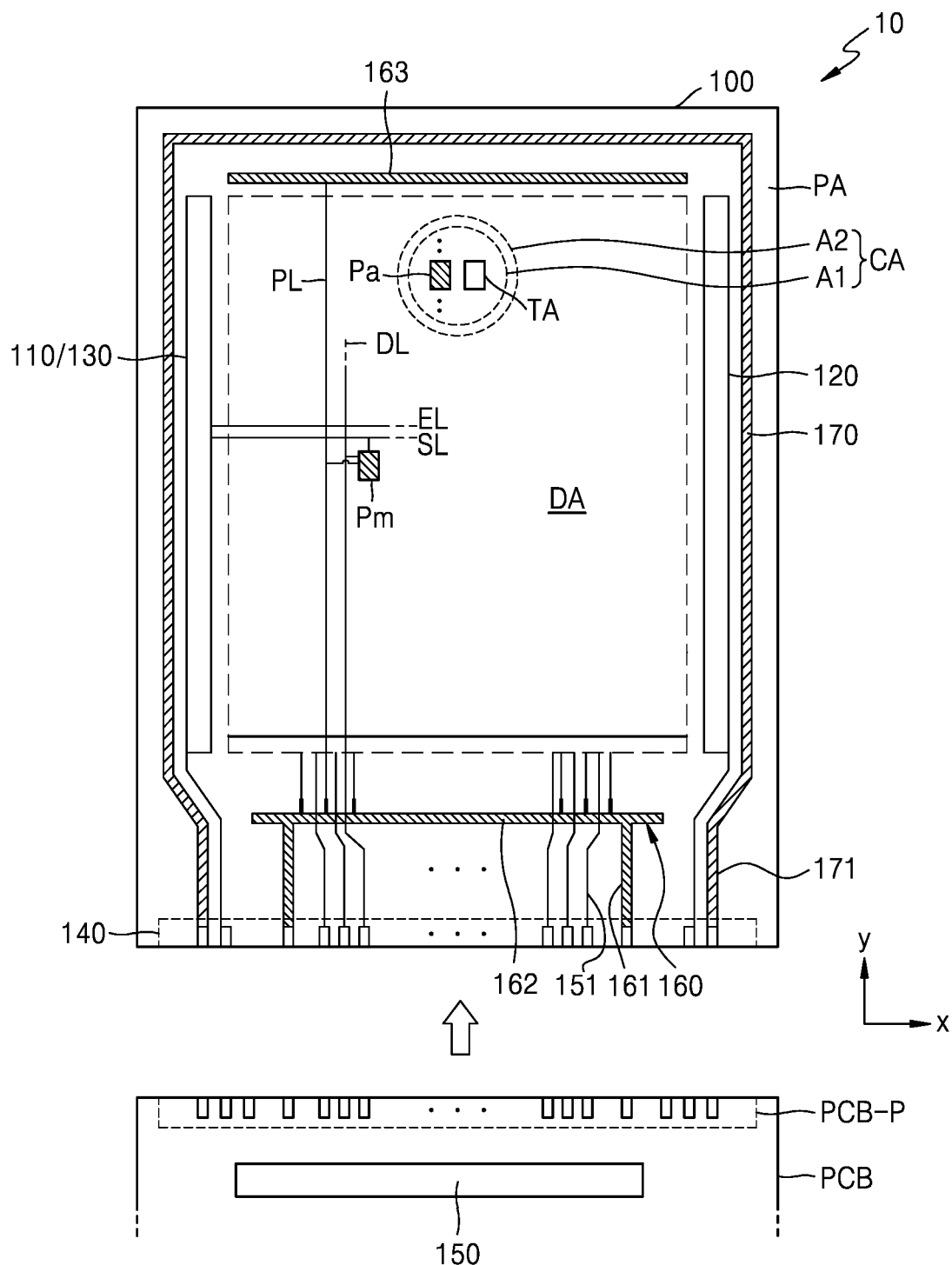
FIG. 3 is a plan view of a display panel according to an embodiment.

FIG. 3 is a plan view of the display panel 10 according to an embodiment.

Referring to FIG. 3, various kinds of elements included in (e.g., constituting) the display panel 10 may be arranged on the substrate 100. The substrate 100 includes the display area DA and the peripheral area PA surrounding (e.g., around a periphery of) the display area DA. The display area DA includes a display area (e.g., a main display area) at (e.g., in or on) which a main image may be displayed, and the component area CA at (e.g., in or on) which an auxiliary image may be displayed. The component area CA may include the transmission area TA therein.

A plurality of main pixels Pm are arranged at (e.g., in or on) the display area DA. Each of the main pixels Pm may include a display element, for example, such as an organic light-emitting diode OLED. Each main pixel Pm may emit light having a suitable or desired color, for example, such as a red color, a green color, a blue color, or a white light, through the organic light-emitting diode OLED. In an embodiment, a main pixel Pm may be a pixel that emits red, green, blue, or white light. The display area DA may be covered by the encapsulation member described above with reference to FIG. 2, and may be protected from external air and/or moisture.

The component area CA may be arranged within (e.g., inside) the display area DA, and a plurality of auxiliary pixels Pa may be arranged at (e.g., in or on) the component area CA. Each of the plurality of auxiliary pixels Pa may include a display element, for example, such as an organic light-emitting diode OLED. Each auxiliary pixel Pa may emit light having a suitable or desired color, for example, such as a red color, a green color, a blue color, or a white light, from the organic light-emitting diode OLED. In an embodiment, the auxiliary pixel Pa may be a pixel that emits red, green, blue, or white light.

The transmission area TA may be located at (e.g., in or on) one side of the plurality of auxiliary pixels Pa at (e.g., in or on) the component area CA. In an embodiment, the transmission area TA may surround (e.g., around a periphery of) the plurality of auxiliary pixels Pa. In another embodiment, the transmission area TA may be arranged in a lattice configuration with the plurality of auxiliary pixels Pa.

Because the component area CA includes the transmission area TA, a resolution of the component area CA may be less than that of the display area DA. For example, the resolution of the component area CA may be about ½, ¼, or ⅜ of the resolution of the display area DA. In an embodiment, the resolution of the display area DA may be about 400 pixels per inch (ppi) or more, and the resolution of the component area CA may be about 200 ppi or about 100 ppi.

Each of the main pixel Pm and the auxiliary pixel Pa may be electrically connected to outer circuits arranged at (e.g., in or on) the peripheral area PA. For example, a first scan driving circuit 110, a second scan driving circuit 120, an emission control driving circuit 130, a terminal 140, a data driving circuit 150, a first power supply line 160, and a second power supply line 170 may be arranged at (e.g., in or on) the peripheral area PA.

The first scan driving circuit 110 may provide a scan signal to each of the main pixel Pm and the auxiliary pixel Pa through a corresponding scan line SL. The first scan driving circuit 110 may provide an emission control signal to each of the main pixel Pm and the auxiliary pixel Pa through a corresponding emission control line EL. The second scan driving circuit 120 may be arranged in parallel to the first scan driving circuit 110 with the display area DA therebetween. In an embodiment, some of the main pixels Pm and the auxiliary pixels Pa may be electrically connected to the first scan driving circuit 110, and others (e.g., the rest or the remaining ones) of the main pixels Pm and the auxiliary pixels Pa may be connected to the second scan driving circuit 120. In another embodiment, the second scan driving circuit 120 may be omitted.

The terminal 140 may be arranged at (e.g., in or on) one side (e.g., a lower side) of the substrate 100. The terminal 140 may be exposed by not being covered by an insulating layer, and may be electrically connected to a printed circuit board PCB. For example, a terminal PCB-P of the printed circuit board PCB may be electrically connected to the terminal 140 of the display panel 10. The printed circuit board PCB is configured to transfer a signal of a controller and/or power to the display panel 10. Control signals generated by the controller may be transferred to the first and second scan driving circuits 110 and 120 through the printed circuit board PCB. The controller may provide first and second power voltages ELVDD and ELVSS (e.g., see FIGS. 5A and 5B) to the first and second power supply lines 160 and 170 through first and second connection lines 161 and 171, respectively. The first power voltage ELVDD may be provided to each of the main pixel Pm and the auxiliary pixel Pa through a driving voltage line PL connected to the first power supply line 160, and the second power voltage ELVSS may be provided to an opposite electrode of each of the main pixel Pm and the auxiliary pixel Pa connected to the second power supply line 170.

The data driving circuit 150 is electrically connected to the data line DL. A data signal of the data driving circuit 150 may be provided to each of the main pixel Pm and the auxiliary pixel Pa through a corresponding connection line 151 and a corresponding data line DL. For example, the connection line 151 may be connected to the terminal 140, and the data line DL being connected to the connection line 151. Although it is shown in FIG. 3 that the data driving circuit 150 may be arranged on the printed circuit board PCB, the present disclosure is not limited thereto, and the data driving circuit 150 may be arranged on the substrate 100 in another embodiment. For example, in this case, the data driving circuit 150 may be arranged between the terminal 140 and the first power supply line 160 on the substrate 100.

The first power supply line 160 may include a first sub-line 162 and a second sub-line 163 extending in an x-axis direction. The first sub-line 162 and the second sub-line 163 may be parallel to each other with the display area DA therebetween. The second power supply line 170 may have a loop shape having one open side, and may partially surround (e.g., around a periphery of) the display area DA.

Figure 4A:
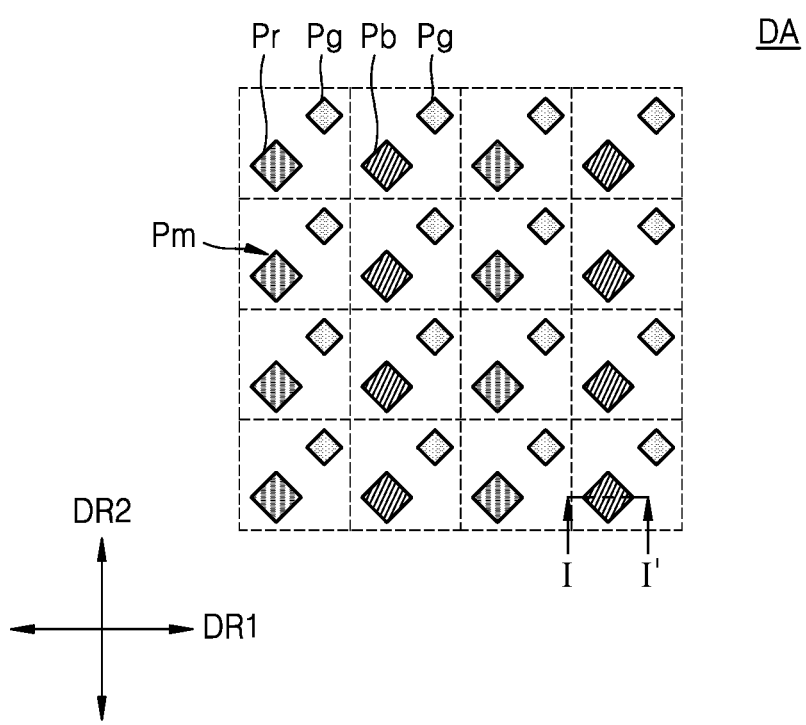
FIGS. 4A-4C are plan views of a pixel arrangement structure according to one or more embodiments.
Figure 4B:
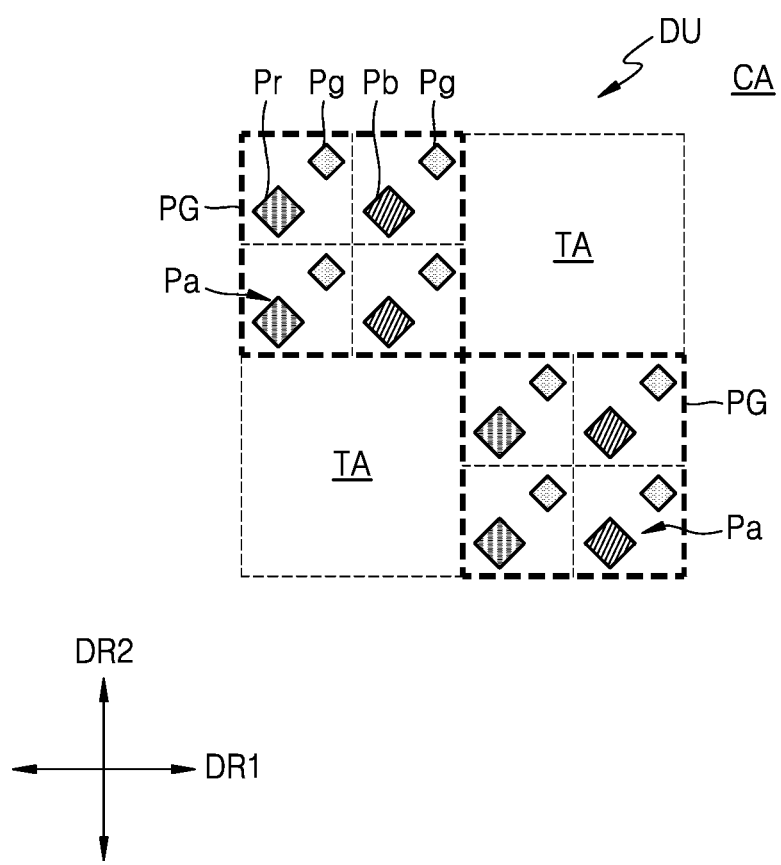
Figure 4C:
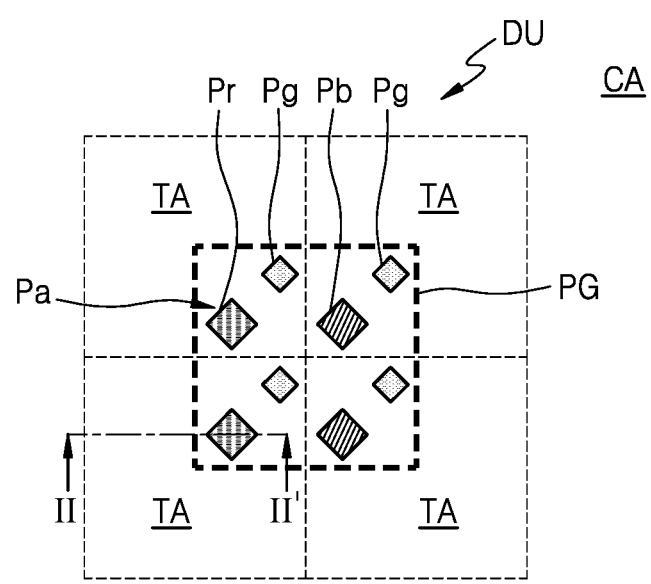

FIGS. 4A to 4C are plan views of a pixel arrangement structure according to one or more embodiments. FIG. 4A shows a pixel arrangement structure inside the display area DA, and FIGS. 4B and 4C show a pixel arrangement structure inside the component area CA.

Referring to FIG. 4A, the plurality of main pixels Pm may be arranged at (e.g., in or on) the display area DA. Each of the plurality of main pixels Pm may include a display element, for example, such as an organic light-emitting diode OLED. The main pixel Pm may be a sub-pixel that emits red, green, blue, or white light.

The plurality of main pixels Pm arranged at (e.g., in or on) the display area DA may include a main pixel Pr that emits red light, a main pixel Pg that emits green light, and a main pixel Pb that emits blue light. Although FIG. 4A shows the plurality of main pixels Pm arranged in a pentile kind of arrangement, the present disclosure is not limited thereto, and the plurality of main pixels Pm may be arranged in a stripe kind of arrangement or in various suitable kinds of shapes and/or arrangements.

Referring to FIG. 4B, a plurality of auxiliary pixels Pa may be arranged at (e.g., in or on) the component area CA. Each of the plurality of auxiliary pixels Pa may include a display element, for example, such as an organic light-emitting diode OLED. The auxiliary pixel Pa may be a sub-pixel that emits red, green, blue, or white light.

The component area CA may include a pixel group PG and the transmission area TA. The pixel group PG may include at least one auxiliary pixel Pa. The pixel group PG and the transmission area TA may be alternately arranged in a first direction DR1 and a second direction DR2 crossing the first direction. In this case, a plurality of pixel groups PG and a plurality of transmission areas TA may be provided at (e.g., in or on) the component area CA.

The pixel group PG may be defined as a set of pixels (e.g., a pixel set) in which a plurality of auxiliary pixels Pa are grouped in a unit (e.g., a predetermined unit). While FIGS. 4B and 4C illustrate that the pixel group PG may include eight auxiliary pixels Pa, the present disclosure is not limited thereto. For example, the number of auxiliary pixels Pa included in the pixel group PG may be variously modified according to the resolution of the component area CA.

The pixel group PG may include an auxiliary pixel Pr that emits red light, an auxiliary pixel Pg that emits green light, and an auxiliary pixel Pb that emits blue light. Although FIG. 4B shows an auxiliary pixel Pa having a pentile kind of arrangement, the present disclosure is not limited thereto, and the auxiliary pixel Pa may be formed in a stripe kind of arrangement or in various suitable kinds of shapes and/or arrangements.

The transmission area TA may be arranged at (e.g., in or on) a side (e.g., one side) of the pixel group PG. While FIG. 4B shows that a plurality of transmission areas TA and a plurality of pixel groups PG may be alternately arranged in a lattice configuration, the present disclosure is not limited thereto, and the transmission areas TA may be arranged to surround (e.g., around a periphery of) the pixel group PG as shown in FIG. 4C, for example.

An auxiliary pixel Pa may not be arranged at (e.g., in or on) the transmission area TA. The absence of an auxiliary pixel Pa may mean that the auxiliary pixel Pa does not include a display element, for example, such as an organic light-emitting diode OLED. In other words, a pixel electrode, an intermediate layer, and an opposite electrode may define (e.g., may constitute) an organic light-emitting diode OLED, and a pixel circuit electrically connected to the organic light-emitting diode OLED may not be arranged at (e.g., in or on) the transmission area TA. Some signal lines PL, DL, SL, and EL (e.g., see FIG. 3) that are connected to an auxiliary pixel Pa located at (e.g., in or on) a pixel area to supply a signal thereto may be located across the transmission area TA. Even in this case, to increase a transmittance of the transmission area TA, the signal lines PL, DL, SL, and EL may extend around (e.g., may detour around) a central portion (e.g., a central area) of the transmission area TA, and be arranged to be biased on one side of the transmission area TA.

In an embodiment, a metal layer may be arranged on the substrate 100 to correspond to the pixel group PG of the component area CA. The metal layer may be arranged below (e.g., under or underneath) the auxiliary pixel Pa, and may be located, for example, between a thin film transistor of the auxiliary pixel Pa and the substrate 100. The metal layer may block or substantially block external light incident to a pixel circuit PC (e.g., see FIGS. 5A and 5B) of the auxiliary pixel Pa that is emitted from the electronic element 20. Because a constant or substantially constant voltage or a signal may be applied to the metal layer, damage to the pixel circuit PC due to electrostatic discharge may be prevented or substantially prevented. The metal layer may be provided as a plurality of metal layers within (e.g., inside) the component area CA. The metal layers may respectively receive different voltages depending on a case or an application of the display device.

A display unit DU shown in FIGS. 4B and 4C may be repeatedly arranged at (e.g., in or on) the component area CA. In the case, when the display unit DU of FIGS. 4B and 4C is repeatedly arranged at (e.g., in or on) the component area CA, the display units DU at (e.g., in or on) the central portion of the component area CA may have the same or substantially the same (or a similar) structure as each other, but may have different structures from those at edge portions of the component area CA. In other words, in the display unit DU of FIG. 4B, the pixel group PG of the component area CA may be adjacent to (e.g., may neighbor) a main pixel Pm at (e.g., in or on) the display area DA. On the other hand, in the display unit DU of FIG. 4C, because the transmission area TA surrounds (e.g., around a periphery of) the pixel group PG, the transmission area TA may be located at an edge portion of the component area CA. In this case, the main pixels Pm may surround the outside (e.g., may surround around a periphery) of the transmission area TA. In an embodiment, because wirings may be arranged at (e.g., in or on) the transmission area TA at the edge portion of the component area CA, the resolution of the component area CA may not be reduced or substantially reduced, and a non-display area between the component area CA and the display area DA may be minimized or reduced.

Figure 5A:
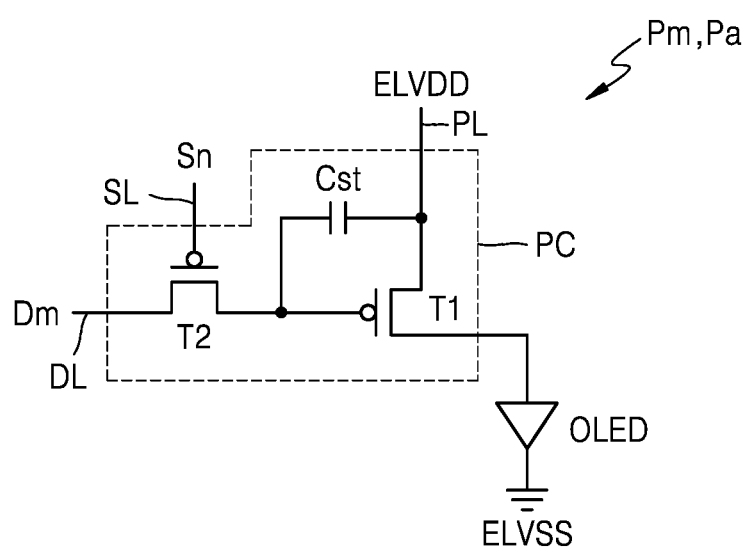
FIGS. 5A-5B are equivalent circuit diagrams of a main pixel and/or an auxiliary pixel that may be included in a display panel according to one or more embodiments.
Figure 5B:
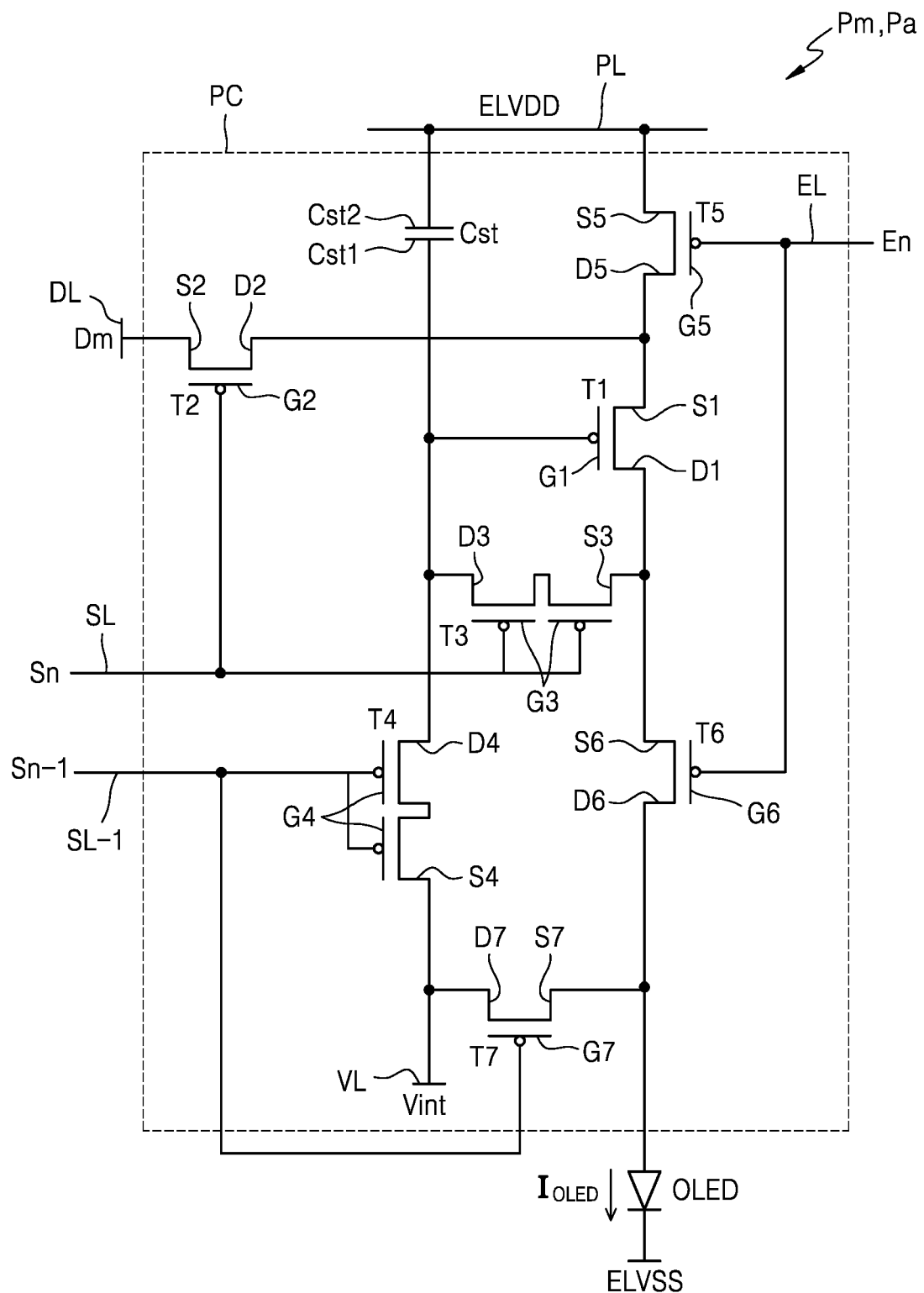

FIGS. 5A and 5B are equivalent circuit diagrams of a main pixel and/or an auxiliary pixel that may be included in a display panel according to an embodiment.

Referring to FIG. 5A, each of the main pixel Pm and/or the auxiliary pixel Pa includes the pixel circuit PC, and the organic light-emitting diode OLED connected to the pixel circuit PC. The pixel circuit PC may be connected to the scan line SL and the data line DL.

The pixel circuit PC includes a driving thin film transistor T1, a switching thin film transistor T2, and a storage capacitor Cst. The switching thin film transistor T2 is connected to the scan line SL and the data line DL, and may be configured to transfer a data signal Dm input through the data line DL to the driving thin film transistor T1 in response to a scan signal Sn input through the scan line SL.

The storage capacitor Cst is connected to the switching thin film transistor T2 and the driving voltage line PL, and may be configured to store a voltage corresponding to a difference between a voltage transferred from the switching thin film transistor T2 and the first power voltage ELVDD (e.g., a driving voltage) supplied to the driving voltage line PL.

The driving thin film transistor T1 is connected to the driving voltage line PL and the storage capacitor Cst, and may be configured to control a driving current flowing through the organic light-emitting diode OLED from the driving voltage line PL in response to the voltage stored in the storage capacitor Cst. The organic light-emitting diode OLED may emit light having a desired or suitable brightness (e.g., a predetermined brightness) according to the driving current.

Although it is shown in FIG. 5A that the pixel circuit PC includes two thin film transistors and one storage capacitor, the present disclosure is not limited thereto. For example, as shown in FIG. 5B, the pixel circuit PC may include seven thin film transistors and one storage capacitor. Further, although it is shown in FIG. 5A that the pixel circuit PC includes one storage capacitor, the present disclosure is not limited thereto, and the pixel circuit PC may include two or more storage capacitors.

Referring to FIG. 5B, each of the main pixel Pm and/or the auxiliary pixel Pa includes the pixel circuit PC, and the organic light-emitting diode OLED connected to the pixel circuit PC. The pixel circuit PC may include a plurality of thin film transistors T1, T2, T3, T4, T5, T6, and T7, and a storage capacitor Cst. The thin film transistors T1, T2, T3, T4, T5, T6, and T7 and the storage capacitor Cst may be connected to signal lines SL, SL-1, EL, and DL, an initialization voltage line VL, and the driving voltage line PL.

Although it is shown in FIG. 5B that each of the main pixel Pm and/or the auxiliary pixel Pa is connected to the signal lines SL, SL-1, EL, and DL, the initialization voltage line VL, and the driving voltage line PL, the present disclosure is not limited thereto. For example, in another embodiment, at least one of the signal lines SL, SL-1, EL, and DL, the initialization voltage line VL, and the driving voltage line PL may be shared by pixels that are adjacent to (e.g., that neighbor) each other.

The signal lines include the scan line SL, the previous scan line SL-1, the emission control line EL, and the data line DL. The scan line SL may be configured to transfer a scan signal Sn, and the previous scan line SL-1 may be configured to transfer a previous scan signal Sn-1 to a first initialization thin film transistor T4 and a second initialization thin film transistor T7. The emission control line EL may be configured to transfer an emission control signal En to an operation control thin film transistor T5 and an emission control thin film transistor T6. The data line DL may be configured to transfer a data signal Dm, and may cross with the scan line SL. The driving voltage line PL may be configured to transfer the driving voltage ELVDD to the driving thin film transistor T1, and the initialization voltage line VL may be configured to transfer an initialization voltage Vint for initializing the driving thin film transistor T1 and a pixel electrode of the organic light-emitting diode OLED.

A driving gate electrode G1 of the driving thin film transistor T1 is connected to a bottom electrode Cst1 of the storage capacitor Cst. A driving source electrode S1 of the driving thin film transistor T1 is connected to the driving voltage line PL through the operation control thin film transistor T5. A driving drain electrode D1 of the driving thin film transistor T1 is electrically connected to the pixel electrode of the organic light-emitting diode OLED through the emission control thin film transistor T6. The driving thin film transistor T1 is configured to receive a data signal Dm according to (e.g., depending on) a switching operation of a switching thin film transistor T2, and to supply a driving current $I_{OLED}$ to the organic light-emitting diode OLED.

A switching gate electrode G2 of the switching thin film transistor T2 is connected to the scan line SL, and a switching source electrode S2 of the switching thin film transistor T2 is connected to the data line DL. A switching drain electrode D2 of the switching thin film transistor T2 is connected to the driving source electrode S1 of the driving thin film transistor T1, and to the driving voltage line PL through the operation control thin film transistor T5. The switching thin film transistor T2 is turned on in response to a scan signal Sn transferred through the scan line SL, and is configured to perform a switching operation of transferring a data signal Dm transferred through the data line DL to the driving source electrode S1 of the driving thin film transistor T1.

A compensation gate electrode G3 of a compensation thin film transistor T3 is connected to the scan line SL. A compensation source electrode S3 of the compensation thin film transistor T3 is connected to the driving drain electrode D1 of the driving thin film transistor T1, and to the pixel electrode of the organic light-emitting diode OLED through the emission control thin film transistor T6. A compensation drain electrode D3 of the compensation thin film transistor T3 is connected to the bottom electrode Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL, and is configured to diode-connect the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1. A first initialization source electrode S4 of the first initialization thin film transistor T4 is connected to a second initialization drain electrode D7 of the second initialization thin film transistor T7, and the initialization voltage line VL. The first initialization drain electrode D4 of the first initialization thin film transistor T4 is connected to the bottom electrode Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1, and is configured to perform an initialization operation of initializing a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, and an operation control source electrode S5 of the operation control thin film transistor T5 is connected to the driving voltage line PL. An operation control drain electrode D5 of the operation control thin film transistor T5 is connected to the driving source electrode S1 of the driving thin film transistor T1, and the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1, and the compensation source electrode S3 of the compensation thin film transistor T3. An emission control drain electrode D6 of the emission control thin film transistor T6 is connected to the second initialization source electrode S7 of the second initialization thin film transistor T7, and the pixel electrode of the organic light-emitting diode OLED.

The operation control thin film transistor T5 and the emission control thin film transistor T6 are concurrently (e.g., simultaneously) turned on in response to an emission control signal En transferred through the emission control line EL to allow the driving voltage ELVDD to be transferred to the organic light-emitting diode OLED, and thus, to allow the driving current $I_{OLED}$ to flow through the organic light-emitting diode OLED.

A second initialization gate electrode G7 of the second initialization thin film transistor T7 is connected to the previous scan line SL-1. The second initialization source electrode S7 of the second initialization thin film transistor T7 is connected to the emission control drain electrode D6 of the emission control thin film transistor T6, and the pixel electrode of the organic light-emitting diode OLED. The second initialization drain electrode D7 of the second initialization thin film transistor T7 is connected to the first initialization source electrode S4 of the first initialization thin film transistor T4, and the initialization voltage line VL. The second initialization thin film transistor T7 is turned on in response to a previous scan signal Sn-1 transferred through the previous scan line SL-1, and is configured to initialize the pixel electrode of the organic light-emitting diode OLED.

Although FIG. 5B shows that the first initialization thin film transistor T4 and the second initialization thin film transistor T7 are connected to the previous scan line SL-1, the present disclosure is not limited thereto. For example, in an embodiment, the first initialization thin film transistor T4 may be connected to the previous scan line SL-1 and may be driven in response to a previous scan signal Sn-1, and the second initialization thin film transistor T7 may be connected to a separate signal line (e.g., the next scan line) and may be driven in response to a signal transferred through the separate signal line.

A top electrode Cst2 of the storage capacitor Cst is connected to the driving voltage line PL, and an opposite electrode of the organic light-emitting diode OLED is connected to the common voltage ELVSS. Therefore, the organic light-emitting diode OLED may be configured to receive the driving current $I_{OLED}$ from the driving thin film transistor T1, and may emit light to display an image.

Although it is shown in FIG. 5B that each of the compensation thin film transistor T3 and the first initialization thin film transistor T4 has a dual gate electrode, the present disclosure is not limited thereto, and at least one (or both) of the compensation thin film transistor T3 and the first initialization thin film transistor T4 may have one gate electrode (e.g., a single gate electrode).

Figure 6:
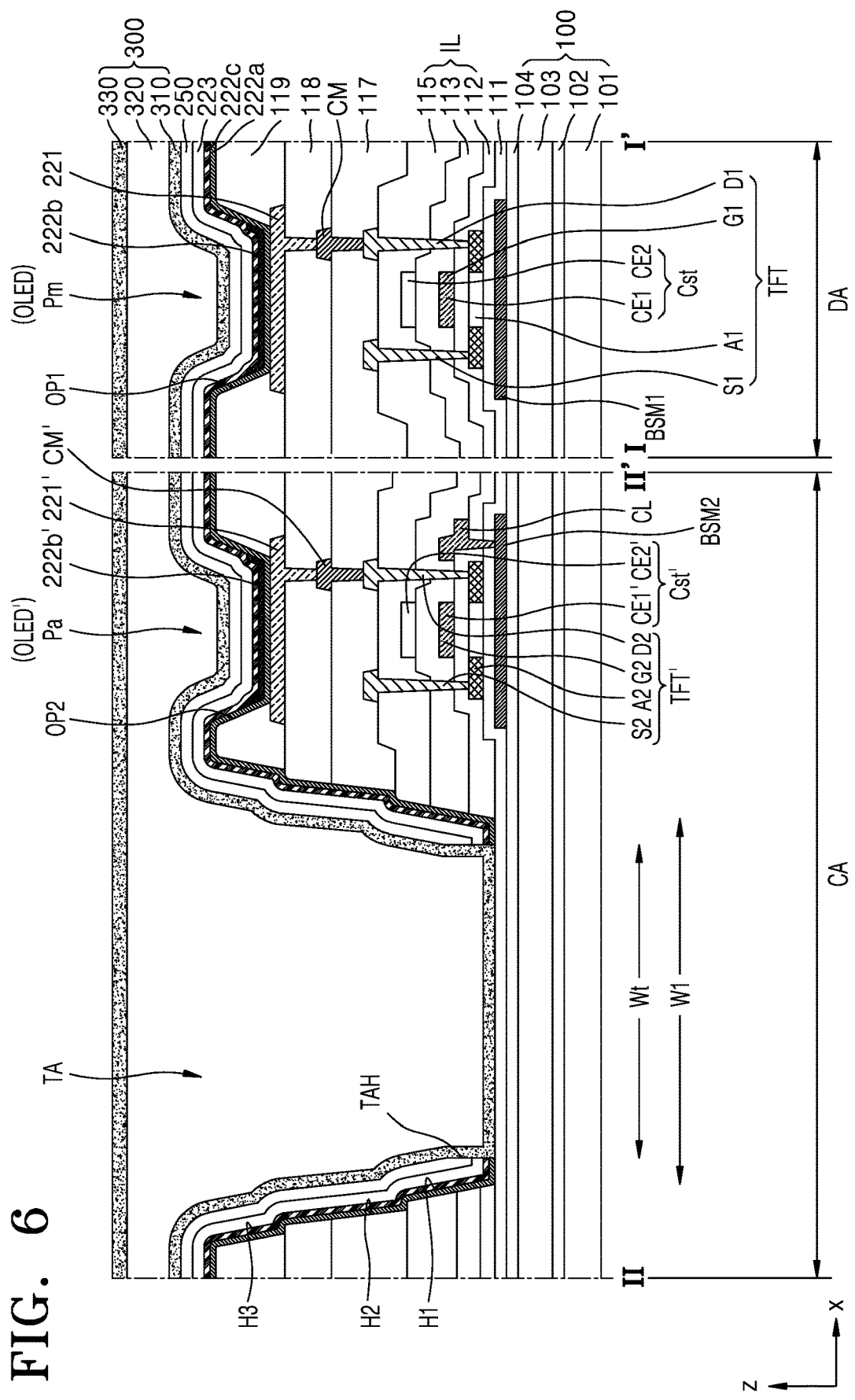
FIG. 6 is a cross-sectional view of a pixel circuit of a pixel according to an embodiment.

FIG. 6 is a cross-sectional view of a pixel circuit of a pixel according to an embodiment.

Referring to FIG. 6, the display device 1 according to an embodiment includes the display area DA and the component area CA. A main pixel Pm is arranged at (e.g., in or on) the display area DA, and an auxiliary pixel Pa and the transmission area TA are arranged at (e.g., in or on) the component area CA.

The main pixel Pm may include a main thin film transistor TFT, a main storage capacitor Cst, and a main organic light-emitting diode OLED. The auxiliary pixel Pa may include an auxiliary thin film transistor TFT', an auxiliary storage capacitor Cst', and an auxiliary organic light-emitting diode OLED'. The transmission area TA may include a transmission hole (e.g., a transmission opening) TAH corresponding to the transmission area TA.

A first metal layer BSM1 may be arranged below (e.g., under or underneath) the main thin film transistor TFT of the main pixel Pm, such that the first metal layer BSM1 overlaps with the main thin film transistor TFT. A second metal layer BSM2 may be arranged below (e.g., under or underneath) the auxiliary thin film transistor TFT' of the auxiliary pixel Pa, such that the second metal layer BSM2 overlaps with the auxiliary thin film transistor TFT'. However, the present disclosure is not limited thereto. For example, in an embodiment, unlike the embodiment shown in FIG. 6, the first metal layer BSM1 overlapping with the main thin film transistor TFT may be omitted.

Hereinafter, a structure in which elements included in the display device 1 are stacked is described according to an embodiment.

The substrate 100 may include a polymer resin. For example, the substrate 100 may include a base layer and an inorganic layer, and the base layer may include a polymer resin. In an embodiment, the substrate 100 may include a first base layer 101, a first inorganic layer 102, a second base layer 103, and a second inorganic layer 104 that are sequentially stacked with one another.

Each of the first and second base layers 101 and 103 may include a polymer resin. For example, the first and second base layers 101 and 103 may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose tri acetate (TAC), and/or cellulose acetate propionate (CAP). The polymer resin may be transparent or substantially transparent.

The first and second inorganic layers 102 and 104 may be inorganic layers for preventing or substantially preventing the penetration of external foreign substances, and may include a single layer structure or a multi-layered structure including an inorganic material, for example, such as silicon nitride ($SiN_x$) and/or silicon oxynitride ($SiO_x$).

A buffer layer 111 may be located on the substrate 100. The buffer layer 111 may reduce or block the penetration of foreign substances, moisture, and/or external air from below (e.g., under or underneath) the substrate 100, and may provide a flat or substantially flat surface on the substrate 100. The buffer layer 111 may include an inorganic material, for example, such as an oxide or a nitride, an organic material, or an organic/inorganic composite material, and may include a single layer structure or a multi-layered structure including an inorganic material and/or an organic material.

In the embodiment shown in FIG. 6, the first metal layer BSM1 and the second metal layer BSM2 may be arranged between the substrate 100 and the buffer layer 111, for example, between the second inorganic layer 104 and the buffer layer 111. However, the present disclosure is not limited thereto, and in another embodiment, the first and second metal layers BSM1 and BSM2 may be arranged under (e.g., underneath) the second inorganic layer 104. For example, the first and second metal layers BSM1 and BSM2 may be arranged between the second base layer 103 and the second inorganic layer 104. In another embodiment, at least one of the first and second metal layers BSM1 and BSM2 may be arranged at (e.g., in or on) a different layer from those described above or from each other.

The second metal layer BSM2 may be arranged below (e.g., under or underneath) the auxiliary pixel Pa to prevent or substantially prevent the auxiliary thin film transistor TFT' arranged at (e.g., in or on) the auxiliary pixel Pa from being damaged, and/or to prevent or substantially prevent a characteristic of the auxiliary thin film transistor TFT' from being deteriorated.

The first metal layer BSM1 may be arranged below (e.g., under or underneath) the main pixel Pm to prevent or substantially prevent the main thin film transistor TFT arranged at (e.g., in or on) the main pixel Pm from being damaged, and/or to prevent or substantially prevent a characteristic of the main thin film transistor TFT from being deteriorated. However, the present disclosure is not limited thereto. For example, in an embodiment, the first metal layer BSM1 may be omitted according to (e.g., depending on) a case or an application of the display device.

The first metal layer BSM1 may be connected to the second metal layer BSM2 through a conductive line CL and a contact hole. The conductive line CL may be arranged at (e.g., in or on) a layer different from the layers at (e.g., in or on) which the first and second metal layers BSM1 and BSM2 are arranged. The first and second metal layers BSM1 and BSM2 may receive a constant or substantially constant voltage or a signal from the conductive line CL. For example, the first and second metal layers BSM1 and BSM2 may receive the driving voltage ELVDD or a scan signal from the conductive line CL. Because the first and second metal layers BSM1 and BSM2 may receive a constant or substantially constant voltage or a signal, the probability that an electrostatic discharge may occur may be reduced (e.g., may be remarkably reduced). However, the present disclosure is not limited thereto, and various modification may be made as would be known to those skilled in the art. For example, in another embodiment, one or both of the first and second metal layers BSM1 and BSM2 may not receive an electric signal. In another example, in an embodiment, at least one of the first and second metal layers BSM1 and BSM2 may be electrically floated. In still another example, in an embodiment, one of the first and second metal layers BSM1 and BSM2 may be electrically floated, and the other of the first and second metal layers BSM1 and BSM2 may receive an electric signal.

The first and second metal layers BSM1 and BSM2 may include at least one from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The first and second metal layers BSM1 and BSM2 may include a single layer structure or a multi-layered structure including one or more of the above materials.

The main thin film transistor TFT and the auxiliary thin film transistor TFT' may be arranged on the buffer layer 111. The main thin film transistor TFT includes a first semiconductor layer A1, a first gate electrode G1, a first source electrode S1, and a first drain electrode D1. The auxiliary thin film transistor TFT' includes a second semiconductor layer A2, a second gate electrode G2, a second source electrode S2, and a second drain electrode D2. The main thin film transistor TFT may be connected to the main organic light-emitting diode OLED at (e.g., in or on) the display area DA, and may drive the main organic light-emitting diode OLED. The auxiliary thin film transistor TFT' may be connected to the auxiliary organic light-emitting diode OLED' at (e.g., in or on) the component area CA, and may drive the auxiliary organic light-emitting diode OLED'.

The first semiconductor layer A1 and the second semiconductor layer A2 may be arranged on the buffer layer 111, and may include, for example, polycrystalline silicon. In another embodiment, the first semiconductor layer A1 and the second semiconductor layer A2 may include, for example, amorphous silicon. In another embodiment, the first semiconductor layer A1 and the second semiconductor layer A2 may include, for example, an oxide including at least one from among indium (In), gallium (Ga), stannum (Sn), zirconium (Zr), vanadium (V), hafnium (Hf), cadmium (Cd), germanium (Ge), chrome (Cr), titanium (Ti), and zinc (Zn). Each of the first semiconductor layer A1 and the second semiconductor layer A2 may include a channel region, a source region, and a drain region. The source region and the drain region may be doped with impurities.

The first semiconductor layer A1 may overlap with the first metal layer BSM1 with the buffer layer 111 therebetween. In an embodiment, a width (e.g., in the x-axis direction) of the first semiconductor layer A1 may be less than a width (e.g., in the x-axis direction) of the first metal layer BSM1. Therefore, when viewed from a direction perpendicular to or substantially perpendicular to the substrate 100 (e.g., when viewed in a plan view), an entirety of the first semiconductor layer A1 may overlap with the first metal layer BSM1.

The second semiconductor layer A2 may overlap with the second metal layer BSM2 with the buffer layer 111 therebetween. In an embodiment, a width (e.g., in the x-axis direction) of the second semiconductor layer A2 may be less than a width (e.g., in the x-axis direction) of the second metal layer BSM2. Therefore, when viewed from a direction perpendicular to the substrate 100 (e.g., when viewed in a plan view), an entirety of the second semiconductor layer A2 may overlap with the second metal layer BSM2.

A first gate insulating layer 112 may cover the first and second semiconductor layers A1 and A2. The first gate insulating layer 112 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide (HfO$_2$), zinc oxide (ZnO$_2$), and/or the like. The first gate insulating layer 112 may include a single layer structure or a multi-layered structure including one or more of the above inorganic insulating materials.

The first gate electrode G1 and the second gate electrode G2 may be arranged over the first gate insulating layer 112 to correspond to the first semiconductor layer A1 and the second semiconductor layer A2, respectively. The first and second gate electrodes G1 and G2 may include a single layer structure or a multi-layered structure including at least one from among molybdenum (Mo), aluminum (Al), copper (Cu), and titanium (Ti). For example, in an embodiment, the first and second gate electrodes G1 and G2 may include a single layer of Mo.

A second gate insulating layer 113 may cover the first and second gate electrodes G1 and G2. The second gate insulating layer 113 may include an inorganic insulating material, for example, such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), and/or the like. The second gate insulating layer 113 may include a single layer structure or a multi-layered structure including one or more of the inorganic insulating materials.

A first top electrode CE2 of the main storage capacitor Cst and a second top electrode CE2' of the auxiliary storage capacitor Cst' may be arranged on the second gate insulating layer 113.

The first top electrode CE2 may overlap with the first gate electrode G1 therebelow at (e.g., in or on) the display area DA. For example, the first gate electrode G1 and the first top electrode CE2 may overlap with each other with the second gate insulating layer 113 therebetween. The first gate electrode G1 and the first top electrode CE2 may define (e.g., may constitute) the main storage capacitor Cst. For example, the first gate electrode G1 may serve as a first bottom electrode CE1 of the main storage capacitor Cst.

The second top electrode CE2' may overlap with the second gate electrode G2 therebelow at (e.g., in or on) the component area CA. For example, the second gate electrode G2 and the second top electrode CE2' may overlap with each other with the second gate insulating layer 113 therebetween. The second gate electrode G2 and the second top electrode CE2' may define (e.g., may constitute) the auxiliary storage capacitor Cst'. For example, the second gate electrode G2 may serve as a second bottom electrode CE1' of the auxiliary storage capacitor Cst'.

The first and second top electrodes CE2 and CE2' may include at least one from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The first and second top electrodes CE2 and CE2' may include a single layer structure or a multi-layered structure including one or more of the above materials.

An interlayer insulating layer 115 may cover the first and second top electrodes CE2 and CE2'. The interlayer insulating layer 115 may include, for example, silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO$_2$).

The first gate insulating layer 112, the second gate insulating layer 113, and the interlayer insulating layer 115 may be collectively referred to as an inorganic insulating layer IL. When the first gate insulating layer 112, the second gate insulating layer 113, and the interlayer insulating layer 115 are collectively referred to as the inorganic insulating layer IL, the inorganic insulating layer IL may include a first hole H1 corresponding to the transmission area TA. The first hole H1 may expose a top surface of the buffer layer 111, or a top surface of the substrate 100. The first hole H1 may include openings of the first gate insulating layer 112, the second gate insulating layer 113, and the interlayer insulating layer 115 that correspond to the transmission area TA, and the openings may overlap with each other. The openings may be formed during respective separate processes, or may be concurrently (e.g., simultaneously) formed with each other during the same process. In the case where the openings are formed during the separate processes, a step difference may be formed on an inner lateral surface of the first hole H1.

In another embodiment, the inorganic insulating layer IL may include a groove instead of the first hole H1 exposing the buffer layer 111.

In another embodiment, the inorganic insulating layer IL may not include the first hole H1 corresponding to the transmission area TA. In this case, because the inorganic insulating layer IL may generally include an inorganic insulating material having a high light transmittance (e.g., an excellent light transmittance), even though the first hole H1 corresponding to the transmission area TA may not be provided, a transmittance of light that may be transmitted and/or received therethrough by the component 20 (e.g., see FIG. 2) may be implemented.

The source electrodes S1 and S2 and the drain electrodes D1 and D2 may be arranged on the interlayer insulating layer 115. The source electrodes S1 and S2 and the drain electrodes D1 and D2 may include a conductive material including, for example, molybdenum (Mo), aluminum (Al), copper (Cu), titanium (Ti), and/or the like. The source electrodes S1 and S2 and the drain electrodes D1 and D2 may include a single layer structure or a multi-layered structure including one or more of the above materials. For example, in an embodiment, the source electrodes S1 and S2 and the drain electrodes D1 and D2 may have a multi-layered structure of Ti/Al/Ti.

The source electrodes S1 and S2 and the drain electrodes D1 and D2 may be covered by a first planarization layer 117. The first planarization layer 117 may have a flat or substantially flat top surface such that first and second pixel electrodes 221 and 221' that are arranged on (e.g., above) the first planarization layer 117 may be formed to be flat or substantially flat.

A second planarization layer 118 may be arranged on the first planarization layer 117. Contact metal layers CM and CM' may be arranged between the first planarization layer 117 and the second planarization layer 118. The contact metal layers CM and CM' may electrically connect the drain electrodes D1 and D2 to the first and second pixel electrodes 221 and 221' through contact holes formed in the first planarization layer 117 and the second planarization layer 118.

The first and second planarization layers 117 and 118 may include a single layer structure or a multi-layered structure including, for example, an organic material or an inorganic material. The first and second planarization layers 117 and 118 may include, for example, a general-purpose polymer such as benzocyclobutene (BCB), polyimide, hexamethyldisiloxane (HMDSO), polymethylmethacrylate (PMMA), and/or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a combination (e.g., a blend) thereof. The first and second planarization layers 117 and 118 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). After the first and second planarization layers 117 and 118 are formed, chemical mechanical polishing may be performed to provide a flat or substantially flat top surface.

The first and second planarization layers 117 and 118 may include a second hole (e.g., a second opening) H2 corresponding to the transmission area TA. The second hole H2 may overlap with the first hole H1. Although it is shown in FIG. 6 that the second hole H2 is greater than (e.g., has a larger width or a larger circumference than that of) the first hole H1, the present disclosure is not limited thereto. For example, in an embodiment, the first and second planarization layers 117 and 118 may cover edges (e.g., inner lateral surfaces) of the first hole H1 of the inorganic insulating layer IL, and thus, in this case, a width (e.g., in the x-axis direction) of the second hole H2 may be less than a width (e.g., in the x-axis direction) of the first hole H1.

The first and second planarization layers 117 and 118 may include an opening that exposes one of the first source electrode S1 and the first drain electrode D1 of the main thin film transistor TFT. The first pixel electrode 221 may be electrically connected to the main thin film transistor TFT through the opening. For example, the first pixel electrode 221 may be electrically connected to the main thin film transistor TFT by contacting the first source electrode S1 or the first drain electrode D1 through the opening (or by contacting the contact metal layer CM arranged in the opening therebetween).

Further, the first and second planarization layers 117 and 118 may include an opening that exposes one of the second source electrode S2 and the second drain electrode D2 of the auxiliary thin film transistor TFT'. The second pixel electrode 221' may be electrically connected to the auxiliary thin film transistor TFT' through the opening. For example, the second pixel electrode 221' may be electrically connected to the auxiliary thin film transistor TFT' by contacting the second source electrode S2 or the second drain electrode D2 through the opening (or by contacting the contact metal layer CM' arranged in the opening therebetween).

The first and second pixel electrodes 221 and 221' may include a conductive oxide, for example, such as indium tin oxide (ITO), zinc oxide (IZO), zinc oxide (ZnO), indium oxide ($In_2O_3$), indium gallium oxide (IGO), and/or aluminum zinc oxide (AZO). In another embodiment, the first and second pixel electrodes 221 and 221' may include a reflective layer including, for example, silver (Ag), magnesium (Mg), aluminum (Al), platinum (Pt), palladium (Pd), gold (Au), nickel (Ni), neodymium (Nd), iridium (Ir), chrome (Cr), or a combination (e.g., a compound) thereof. In another embodiment, the first and second pixel electrodes 221 and 221' may further include, for example, a layer including ITO, IZO, ZnO, and/or $In_2O_3$ that is on or under (e.g., underneath) the reflective layer. In another embodiment, the first and second pixel electrodes 221 and 221' may have a stacked structure of ITO/Ag/ITO.

A pixel-defining layer 119 may cover edges of the first and second pixel electrodes 221 and 221'. The pixel-defining layer 119 includes first and second openings OP1 and OP2 overlapping with the first and second pixel electrodes 221 and 221', respectively, and defining a pixel region of a pixel. The pixel-defining layer 119 may prevent or substantially prevent an arc and/or the like from occurring (e.g., from being formed) at the edges of the first and second pixel electrodes 221 and 221' by increasing a distance between the edges of the first and second pixel electrodes 221 and 221' and an opposite electrode 223 on (e.g., arranged over) the first and second pixel electrodes 221 and 221'. The pixel-defining layer 119 may include at least one from among polyimide, polyamide, an acrylic resin, BCB, HMDSO, and a phenolic resin. The pixel-defining layer 119 may be formed by any suitable method, for example, such as spin coating.

The pixel-defining layer 119 may include a third hole H3 located at (e.g., in or on) the transmission area TA. The third hole H3 may overlap with the first hole H1 and the second hole H2. Because the first to third holes H1, H2, and H3 are formed, a light transmittance of the transmission area TA may be improved. The opposite electrode 223 described in more detail below may be arranged on (e.g., arranged over) inner walls of the first to third holes H1, H2, and H3.

A first functional layer 222a may cover the pixel-defining layer 119. The first functional layer 222a may include a single layer structure or a multi-layered structure. In an embodiment, the first functional layer 222a may include a hole transport layer (HTL), which may have a single-layer structure. In another embodiment, the first functional layer 222a may include a hole injection layer (HIL) and an HTL. The first functional layer 222a may be provided as one body to correspond to the main pixels Pm and the auxiliary pixels Pa at (e.g., in or on) the display area DA and the component area CA.

First and second emission layers 222b and 222b' may be arranged on the first functional layer 222a. The first and second emission layers 222b and 222b' may corresponding to the first and second pixel electrodes 221 and 221', respectively. The first and second emission layers 222b and 222b' may include, for example, a polymer material or a low molecular weight material, and may emit red, green, blue, or white light.

A second functional layer 222c may be formed on the first and second emission layers 222b and 222b'. The second functional layer 222c may include a single layer structure or a multi-layered structure. For example, the second functional layer 222c may include an electron transport layer (ETL) and/or an electron injection layer (EIL). The second functional layer 222c may be provided as one body to correspond to the main pixels Pm and the auxiliary pixels Pa at (e.g., in or on) the display area DA and the component area CA. In another embodiment, the first functional layer 222a and/or the second functional layer 222c may be omitted.

The opposite electrode 223 may be arranged on the second functional layer 222c. The opposite electrode 223 may include a conductive material having a low work function. For example, the opposite electrode 223 may include a (semi)-transparent layer including, for example, silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or a combination (e.g., an alloy) thereof. In an embodiment, the opposite electrode 223 may further include a layer including, for example, ITO, IZO, ZnO, or $In_2O_3$, which may be arranged on and/or under the (semi)-transparent layer including one or more of the above materials. The opposite electrode 223 may be provided as one body to correspond to the main pixels Pm and the auxiliary pixels Pa at (e.g., in or on) the display area DA and the component area CA.

Layers from the first pixel electrode 221 to the opposite electrode 223 formed at (e.g., in or on) the display area DA may define (e.g., may constitute) the main organic light-emitting diode OLED. Layers from the second pixel electrode 221' to the opposite electrode 223 formed at (e.g., in or on) the component area CA may define (e.g., may constitute) the auxiliary organic light-emitting diode OLED'.

A capping layer 250 may be formed on the opposite electrode 223. In an embodiment, the capping layer 250 may include, for example, LiF. In another embodiment, the capping layer 250 may include an inorganic insulating material, for example, such as silicon nitride, and/or an organic insulating material. However, the present disclosure is not limited thereto, and in another embodiment, the capping layer 250 may be omitted.

In the embodiment shown in FIG. 6, the first functional layer 222a, the second functional layer 222c, the opposite electrode 223, and the capping layer 250 may each include a transmission hole TAH corresponding to the transmission area TA. In other words, the first functional layer 222a, the second functional layer 222c, the opposite electrode 223, and the capping layer 250 may each include an opening corresponding to the transmission area TA. In an embodiment, widths (e.g., in the x-axis direction) of the openings defining (e.g., constituting) the transmission hole TAH may be the same or substantially the same as each other. For example, a width (e.g., in the x-axis direction) of the opening of the opposite electrode 223 may be equal to or substantially equal to a width (e.g., in the x-axis direction) of the transmission hole TAH.

As used herein, the transmission hole TAH corresponding to the transmission area TA may refer to a case where the transmission hole TAH overlaps with the transmission area TA. In this case, an area of the transmission hole TAH may be less than an area of the first hole H1 formed in the inorganic insulating layer IL. For example, as shown in FIG. 6, a width Wt of the transmission hole TAH may be less than a width W1 of the first hole H1. Here, the area of the transmission hole TAH and the area of the first hole H1 may be defined as an area of an opening having a smallest area.

As the transmission hole TAH is provided, a portion of the opposite electrode 223 may be removed from the transmission area TA, and a light transmittance of the transmission area TA may be improved (e.g., may be remarkably improved). For example, the opposite electrode 223 located at (e.g., in or on) the transmission area TA may be formed by removing a portion of the opposite electrode 223 that corresponds to the transmission area TA through a laser lift-off process, or may be formed through a fine metal mask (FMM) patterning process. Hereinafter, the embodiment shown in FIG. 6 may be described based on the assumption that the opposite electrode 223 is formed at (e.g., in or on) the component area CA through the FMM patterning process.

The main organic light-emitting diode OLED and the auxiliary organic light-emitting diode OLED' may be sealed by the thin-film encapsulation layer 300. The thin-film encapsulation layer 300 may be arranged on the capping layer 250. The thin-film encapsulation layer 300 may prevent or substantially prevent external moisture and/or foreign substances from penetrating into the main organic light-emitting diode OLED and the auxiliary organic light-emitting diode OLED'.

The thin-film encapsulation layer 300 may include at least one inorganic encapsulation layer, and at least one organic encapsulation layer. For example, as shown in FIG. 6, the thin-film encapsulation layer 300 may have a structure in which a first inorganic encapsulation layer 310, an organic encapsulation layer 320, and a second inorganic encapsulation layer 330 are stacked on one another. However, the present disclosure is not limited thereto, and in another embodiment, the number of organic encapsulation layers, the number of inorganic encapsulation layers, and a stacking sequence (e.g., a stacking order) thereof may be variously modified.

The first inorganic encapsulation layer 310 and the second inorganic encapsulation layer 330 may each include, for example, at least one inorganic insulating material from among aluminum oxide, titanium oxide, tantalum oxide, hafnium oxide, zinc oxide, silicon oxide, silicon nitride, and silicon oxynitride, and may be formed by using, for example, chemical vapor deposition (CVD). The organic encapsulation layer 320 may include, for example, a polymer-based material. The polymer-based material may include, for example, a silicon-based resin, an acryl-based resin, an epoxy-based resin, polyimide, and/or polyethylene.

The first inorganic encapsulation layer 310, the organic encapsulation layer 320, and the second inorganic encapsulation layer 330 may be formed as one body to cover the display area DA and the component area CA. Therefore, the first inorganic encapsulation layer 310, the organic encapsulation layer 320, and the second inorganic encapsulation layer 330 may be arranged within (e.g., inside) the transmission hole TAH.

In another embodiment, the organic encapsulation layer 320 may be formed as one body to cover the display area DA and the component area CA, and the organic encapsulation layer 320 may not be arranged at (e.g., in or on) the transmission area TA. In other words, the organic encapsulation layer 320 may include an opening corresponding to the transmission area TA. In this case, the first inorganic encapsulation layer 310 may contact the second inorganic encapsulation layer 330 within (e.g., inside) the transmission hole TAH.

Figure 7:
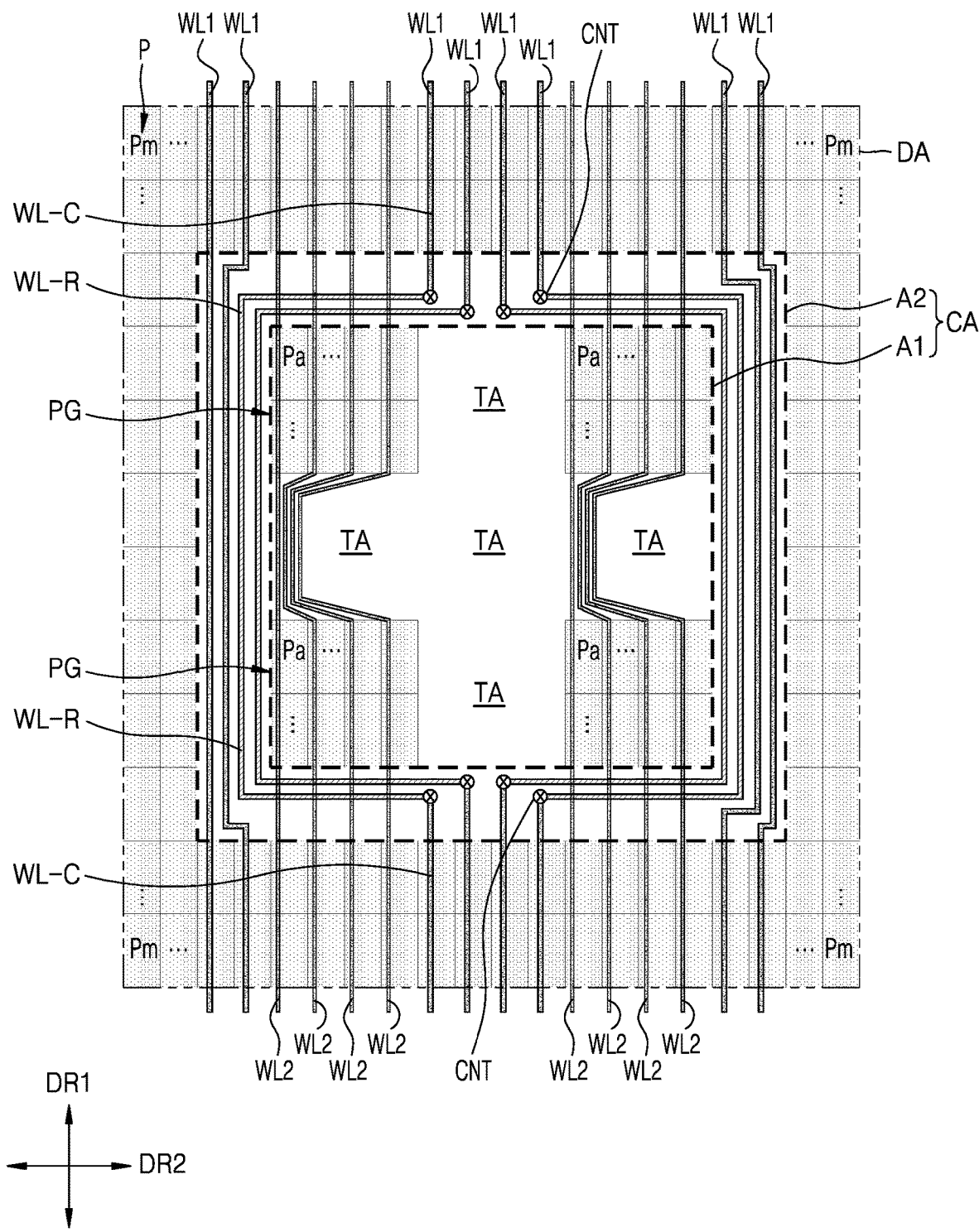
FIG. 7 is a plan view of an arrangement relation of a pixel and a wiring of a display device according to an embodiment.
Figure 8:
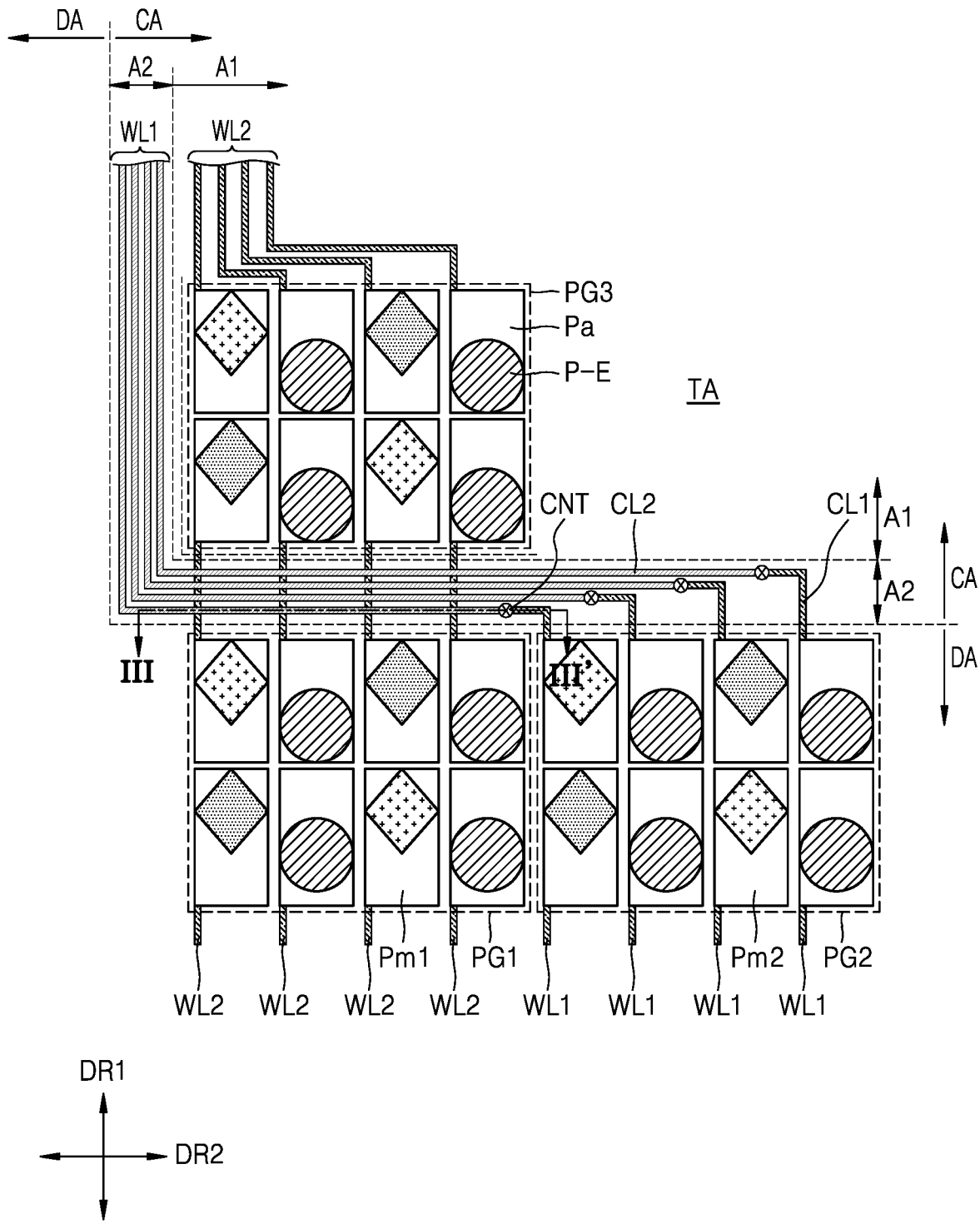
FIG. 8 is an enlarged plan view of a partial region of FIG. 7.
Figure 9:
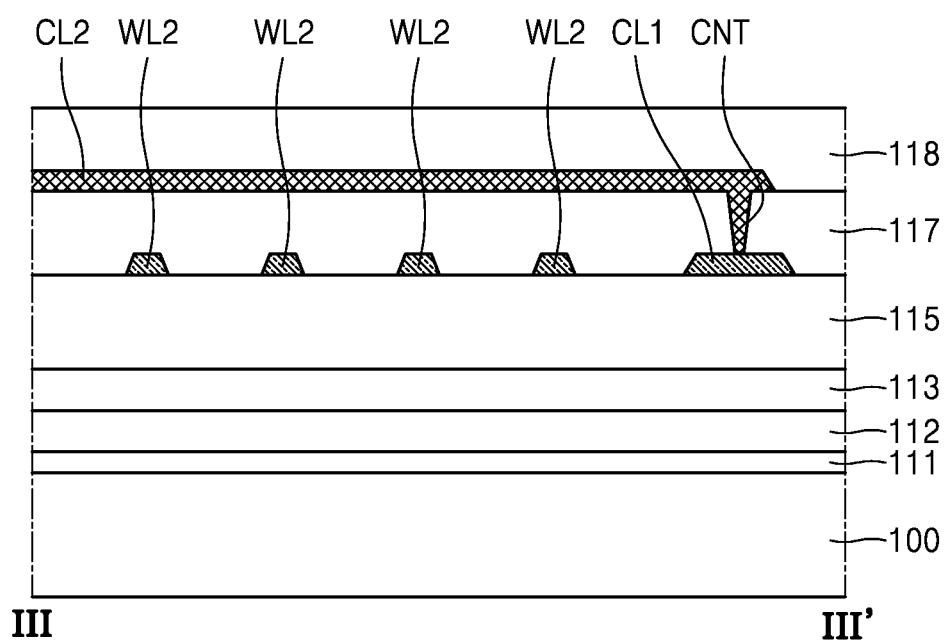
FIG. 9 is a cross-sectional view of the partial region taken along the line III-III' of FIG. 8.

FIG. 7 is a plan view of an arrangement relation of a pixel and a wiring of a display device according to an embodiment, FIG. 8 is an enlarged plan view of a partial region of FIG. 7, and FIG. 9 is a cross-sectional view of the partial region taken along the line III-III' of FIG. 8. For example, FIG. 7 shows the component area CA and a portion of the display area DA adjacent thereto.

Referring to FIG. 7, a plurality of pixels P may be arranged at (e.g., in or on) the display area DA and the component area CA. The plurality of pixels P may be arranged in a first direction DR1 and a second direction DR2. A plurality of main pixels Pm from among the plurality of pixels P may be successively arranged at (e.g., in or on) the display area DA.

A plurality of auxiliary pixels Pa from among the plurality of pixels P may be arranged at (e.g., in or on) the component area CA, except for the transmission area TA (e.g., and not arranged at the transmission area TA). In other words, at least a portion of an area at (e.g., in or on) which the plurality of auxiliary pixels Pa are not arranged may be defined as the transmission area TA. The plurality of auxiliary pixels Pa may be arranged at (e.g., in or on) a first area A1 of the component area CA. In this case, the plurality of auxiliary pixels Pa may not be arranged at (e.g., in or on) a second area A2 of the component area CA that surrounds (e.g., around a periphery of) the first area A1. Although FIG. 7 shows a configuration in which four display units DU of FIG. 4C are successively arranged (e.g., are collected and repeated) at the component area CA, the present disclosure is not limited thereto, and in another embodiment, more than four display units DU may be successively arranged (e.g., may be collected and repeated) at the component area CA.

The plurality of auxiliary pixels Pa at (e.g., in or on) the component area CA may form a group, and may define (e.g., may constitute) a pixel group PG. The pixel group PG may be provided as a plurality of pixel groups. In an embodiment, as shown in FIG. 7, the pixel group (e.g., each of the pixel groups) PG may include eight auxiliary pixels Pa, but the present disclosure is not limited thereto.

A plurality of second wirings WL2 extending in the first direction DR1 may be arranged at (e.g., in or on) the component area CA. The plurality of second wirings WL2 may be connected to the plurality of auxiliary pixels Pa, respectively. Further, the plurality of second wirings WL2 may extend in the first direction DR1, and may be connected to the plurality of main pixels Pm that are arranged at (e.g., in or on) the same columns as those of the plurality of auxiliary pixels Pa. In this case, when an element is referred to as being connected to a pixel, the element may be connected to a pixel circuit PC of the pixel to supply a signal or a power to the pixel. In an embodiment, the plurality of second wirings WL2 may correspond to (e.g., may be) the data lines DL or the driving voltage line PL.

The plurality of second wirings WL2 may extend in the first direction DR1, and may extend across (e.g., may pass across) the transmission area TA. In other words, at least some of the plurality of second wirings WL2 may overlap with the transmission area TA. At (e.g., in or on) a region of the transmission area TA that overlaps with the plurality of second wirings WL2, the plurality of second wirings WL2 may be arranged at (e.g., to be biased on) one side of the transmission area TA. In this case, although a light transmittance of the area of the transmission area TA at (e.g., in or on) which the plurality of second wirings WL2 overlap with the transmission area TA may be less than a light transmittance of other areas of the transmission area TA (e.g., other areas of the transmission area TA where the plurality of second wirings WL2 do not overlap therewith), a high light transmittance may be secured in the other areas of the transmission area TA.

A plurality of first wirings WL1 extending in the first direction DR1 may be arranged at (e.g., in or on) the display area DA. The plurality of first wirings WL1 may be connected to the plurality of main pixels Pm, respectively. Unlike the plurality of second wirings WL2, the plurality of first wirings WL1 may not be connected to the plurality of auxiliary pixels Pa. In other words, the auxiliary pixel Pa may not be arranged at (e.g., in or on) the component area CA at (e.g., in or on) the same column in the first direction DR1 at (e.g., in or on) which the plurality of first wirings WL1 extend. For example, only the transmission area TA may be arranged at (e.g., in or on) the component area CA at (e.g., in or on) the same column at (e.g., in or on) which the first wirings WL1 extend.

In the embodiment shown in FIG. 7, the plurality of first wirings WL1 may include an extension portion WL-C and a detouring portion WL-R. The extension portion WL-C may be arranged at (e.g., in or on) the display area DA, and the detouring portion WL-R may be arranged at (e.g., in or on) the second area A2 of the component area CA. In other words, at the component area CA, the plurality of first wirings WL1 may be arranged to extend across (e.g., to pass across) only the second area A2, and to detour around the first area A1 of the component area CA. As described above, because the transmission area TA may be arranged at (e.g., in or on) the first area A1, when the plurality of first wirings WL1 are arranged to extend across (e.g., to pass across) the first area A1 without the detouring portion WL-R, a light transmittance of the transmission area TA may be reduced by the plurality of first wirings WL1. Further, because the first area A1 may be a central portion of the component area CA, which may be a region in which a component is arranged or substantially arranged, and which may influence (e.g., may directly influence) a light transmittance used for an operation of the component, it may be desirable (e.g., it may be very important) to secure the light transmittance of the first area A1.

In the display device 1 according to one or more example embodiments, the plurality of first wirings WL1 may be arranged at (e.g., in or on) the second area A2 to detour around the edge (e.g., a periphery) of the component area CA, and the plurality of first wirings WL1 may connect the plurality of main pixels Pm arranged in the first direction DR1 to each other with the component area CA therebetween. In this case, a signal or a power may be transferred (e.g., may be effectively transferred) to the plurality of main pixels Pm arranged at (e.g., in or on) the display area DA, without a reduction or a substantial reduction of the light transmittance of the transmission area TA of the component area CA.

As shown in FIG. 7, the plurality of second wirings WL2 may extend in the first direction DR1, and may be located at (e.g., in or on) the second area A2 (e.g., may extend across the second area A2). In this case, to allow the plurality of first wirings WL1 to detour around the second area A2 as described above, the plurality of first wirings WL1 may be electrically insulated from some of the plurality of second wirings WL2 that extend (e.g., that pass) across the second area A2. Therefore, the extension portion WL-C and the detouring portion WL-R of the plurality of first wirings WL1 may be arranged at (e.g., in or on) different layers from each other, and may be electrically connected to each other through a contact hole CNT. For example, as shown in FIG. 7, the contact hole CNT may be located at (e.g., in or on) the second area A2.

FIG. 8 is an enlarged plan view of a lower left end portion of the component area CA of FIG. 7.

A plurality of pixel groups PG1, PG2, and PG3 may be arranged at (e.g., in or on) the first area A1 of the component area CA, and the display area DA. The plurality of pixel groups PG1, PG2, and PG3 may each include a plurality of main pixels Pm1 and Pm2, or a plurality of auxiliary pixels Pa.

Although FIG. 8 shows a structure in which the plurality of main pixels Pm1 and Pm2 and the plurality of auxiliary pixels Pa are arranged in a pentile kind of arrangement, the present disclosure is not limited thereto. In another embodiment, the arrangement of the plurality of main pixels Pm1 and Pm2 may be different from the arrangement of the plurality of auxiliary pixels Pa. For example, the plurality of main pixels Pm1 and Pm2 may be arranged in a pentile kind of arrangement, and the plurality of auxiliary pixels Pa may be arranged in a stripe kind of arrangement. FIG. 8 shows an emission area P-E defined as the openings OP1 and OP2 of the pixel-defining layer 119 of FIG. 6 in each of the pixels Pa, Pm1, and Pm2. The emission area P-E may be an area that emits or substantially emits light, and may be provided in various suitable shapes (e.g., as those shown in FIG. 8).

Although it is shown in FIG. 8 that each of the plurality of pixel groups PG1, PG2, and PG3 includes eight pixels Pa, Pm1, and Pm2, the present disclosure is not limited thereto.

The plurality of pixel groups PG1, PG2, and PG3 may include a first pixel group PG1 and a second pixel group PG2 at (e.g., in or on) the display area DA, and a third pixel group PG3 at (e.g., in or on) the component area CA. The first pixel group PG1 at (e.g., in or on) the display area DA may be arranged at (e.g., in or on) the same column as a column at (e.g., in or on) which the third pixel group PG3 at (e.g., in or on) the component area CA is arranged. In other words, the first pixel group PG1 may be arranged at the same column as that of the third pixel group PG3. An auxiliary pixel is not provided at (e.g., in or on) the same column of the component area CA as a column of the display area DA at (e.g., in or on) which the second pixel group PG2 is provided. In other words, an auxiliary pixel is not provided at (e.g., in or on) the component area CA at the same column as that of the second pixel group PG2.

The plurality of second wirings WL2 extending in the first direction DR1 may be connected to the first pixel group PG1 at (e.g., in or on) the display area DA, and the third pixel group PG3 at (e.g., in or on) the component area CA, the first pixel group PG1 and the third pixel group PG3 being arranged at (e.g., in or on) the same column as each other. In an embodiment, the plurality of second wirings WL2 may include the data lines DL. In another embodiment, the plurality of second wirings WL2 may include the driving voltage line PL.

The plurality of second wirings WL2 may be arranged in the first direction DR1 at (e.g., in or on) the display area DA, and may extend to the first area A1 beyond the second area A2 of the component area CA. In this case, some of the plurality of second wirings WL2 may be arranged to be biased on one side of the transmission area TA to improve a light transmittance of the transmission area TA.

The plurality of first wirings WL1 extending in the first direction DR1 may be connected to the second pixel group PG2 at (e.g., in or on) the display area DA. Although not shown in FIG. 8, the plurality of first wirings WL1 may be connected to a fourth pixel group located at an opposite side of the component area CA from that of the second pixel group PG2 with the component area CA therebetween.

The plurality of first wirings WL1 may be arranged in the first direction DR1 at (e.g., in or on) the display area DA, and may detour along the second area A2. In other words, the plurality of first wirings WL1 may not overlap with the first area A1 of the component area CA. As used herein, the plurality of first wirings WL1 not overlapping with the first area A1 may refer to a case where the plurality of first wirings WL1 do not overlap with the transmission area TA of the first area A1. Therefore, in this case, a light transmittance of the transmission area TA may be improved (e.g., may be effectively improved).

The plurality of first wirings WL1 may include a first conductive layer CL1, and a second conductive layer CL2 electrically connected to the first conductive layer CL1. An insulating layer may be arranged between the first conductive layer CL1 and the second conductive layer CL2. The first conductive layer CL1 may be electrically connected to the second conductive layer CL2 through a contact hole CNT defined in the insulating layer. In an embodiment, the insulating layer may be arranged on the first conductive layer CL1, and the second conductive layer CL2 may be arranged on the insulating layer.

Referring to FIG. 9, the first conductive layer CL1 may be electrically connected to the second conductive layer CL2 through the contact hole CNT defined in the insulating layer (e.g. the first planarization layer 117 as shown in FIG. 6). A stacked structure of FIG. 9 may correspond to a stacked structure of FIG. 6.

In an embodiment, the first conductive layer CL1 may include the same or substantially the same material as those of the source electrodes S1 and S2 and/or the drain electrodes D1 and D2 of the thin film transistors TFT and TFT'.

In an embodiment, the second conductive layer CL2 may include the same or substantially the same material as those of the contact metal layers CM and CM'. In this case, a conductive layer CL3 defining (e.g., constituting) the plurality of second wirings WL2 may be arranged at (e.g., in or on) the same layer as a layer at (e.g., in or on) which the first conductive layer CL1 is arranged. In other words, the third conductive layer CL3 may include the same or substantially the same material as that of the first conductive layer CL1.

In an embodiment, it may be sufficient that the first conductive layer CL1 and the second conductive layer CL2 are arranged at (e.g., in or on) different layers from each other. Because the second conductive layer CL2 may include the detouring portion WL-R (e.g., see FIG. 7) and may overlap with other wirings (e.g., the second wirings WL2) arranged at (e.g., in or on) the second area A2, the second conductive layer CL2 may be arranged at (e.g., in or on) a layer different from those at (e.g., in or on) which the other wirings are arranged, such that the second conductive layer CL2 may be electrically isolated from the other wirings (e.g., the second conductive layer CL2 may not be electrically short-circuited with the other wirings), or may be designed to avoid the other wirings.

In another embodiment, in a case where the area (e.g., the size) of the second area A2 may not be sufficient (e.g., may not be sufficiently large enough) to arrange the detouring portion WL-R of the first wiring WL1 thereon, a portion of the detouring portion WL-R of the first wiring WL1 may be arranged at (e.g., in or on) an edge region (e.g., a periphery region) of the first area A1. In this case, a portion of the detouring portion WL-R of the first wiring WL1 may overlap with the transmission area TA. Even in this case, because the area at (e.g., in or on) which a portion of the detouring portion WL-R of the first wiring WL1 is arranged may be an outer portion (e.g., a periphery portion) of the first area A1, even when a portion of the detouring portion WL-R is arranged at (e.g., in or on) the outer portion, there may almost be no influence on a component, for example, a camera arranged in the component area CA, and thus, the component may maintain or substantially maintain its performance.

Figure 10:
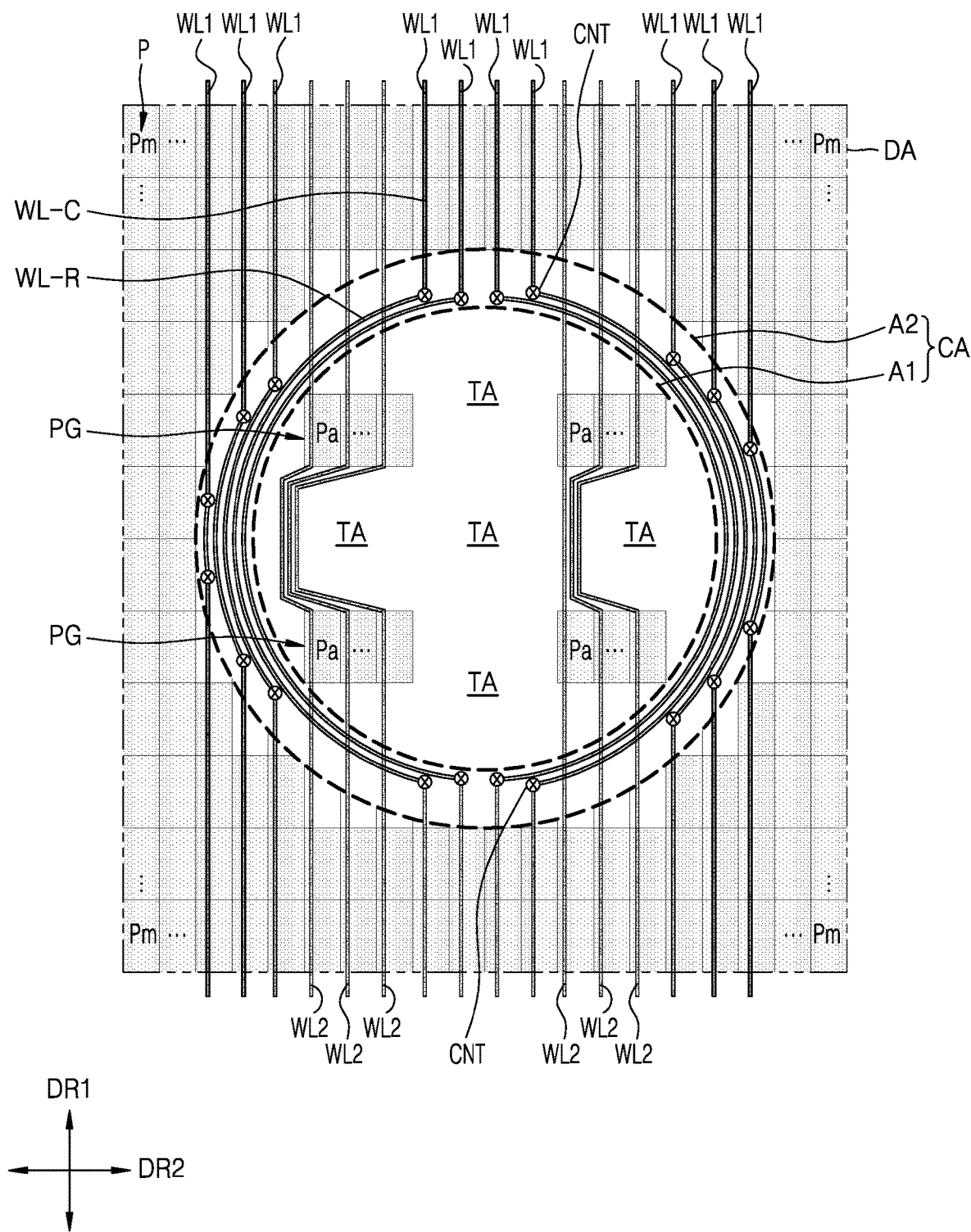
FIG. 10 is a plan view of an arrangement relation of a pixel and a wiring of a display device according to an embodiment.

FIG. 10 is a plan view of an arrangement relation of a pixel and a wiring of a display device according to an embodiment. FIG. 10 may show a modified embodiment of FIG. 7.

For example, the embodiment shown in FIG. 10 may be different from that shown in FIG. 7, in that the shape of the component area CA may be different. For example, while FIG. 7 shows a structure in which the component area CA has a quadrangular shape or an approximate quadrangular shape in a plan view, FIG. 10 shows that the component area CA may have a circular shape in a plan view. In FIG. 10, elements that are the same or substantially the same as those of FIG. 7 are denoted with the same or similar reference symbols, and thus, redundant description thereof may be simplified or may not be repeated.

Referring to FIG. 10, a plurality of pixels P may be arranged at (e.g., in or on) the display area DA and the component area CA. The plurality of pixels P may be arranged in the first direction DR1 and the second direction DR2. The plurality of main pixels Pm arranged at (e.g., in or on) the display area DA from among the plurality of pixels P may be successively arranged. Because the component area CA may be provided in a circular shape, the pixels P at (e.g., in or on) the display area DA outside (e.g., adjacent to) the component area CA may be arranged stepwise.

The component area CA may have a circular shape in a plan view. The first area A1 may be arranged at (e.g., in or on) a central portion (e.g., a central area) of the component area CA, and the second area A2 may have a ring shape surrounding (e.g., around a periphery of) the first area A1. A width of the second area A2 may be variously modified, but in an embodiment, the width of the second area A2 may not exceed (e.g., may not be larger than) a width of a pixel group PG.

A plurality of auxiliary pixels Pa arranged at (e.g., in or on) the component area CA from among the plurality of pixels P may be arranged at the component area CA, except the transmission area TA. In other words, at least a portion of a region of the component area CA at (e.g., in or on) which the plurality of auxiliary pixels Pa are not arranged may be defined as the transmission area TA. The plurality of auxiliary pixels Pa may be arranged at (e.g., in or on) the first area A1 of the component area CA. In this case, the plurality of auxiliary pixels Pa may not be arranged at (e.g., in or on) the second area A2 of the component area CA that surrounds (e.g., around a periphery of) the first area A1.

The plurality of auxiliary pixels Pa may form a group to define (e.g., to constitute) a pixel group PG at (e.g., in or on) the component area CA. The pixel group PG may be provided as a plurality of pixel groups. In an embodiment, although it is shown in FIG. 10 that each pixel group PG may include three auxiliary pixels Pa, the present disclosure is not limited thereto.

A plurality of second wirings WL2 extending in the first direction DR1 may be arranged at (e.g., in or on) the component area CA. The plurality of second wirings WL2 may be connected to the plurality of auxiliary pixels Pa, respectively. Further, the plurality of second wirings WL2 may extend in the first direction DR1, and may also be connected to the plurality of main pixels Pm arranged at (e.g., in or on) the same column as those of the plurality of auxiliary pixels Pa. In an embodiment, the plurality of second wirings WL2 may include the data lines DL or the driving voltage line PL.

The plurality of second wirings WL2 may extend in the first direction DR1, and may extend across (e.g., may pass across) the transmission area TA. At (e.g., in or on) a region of the transmission area TA that overlaps with the plurality of second wirings WL2, the plurality of second wirings WL2 may be arranged to be biased on one side of the transmission area TA. A light transmittance of the region of the transmission area TA across which the plurality of second wirings WL2 extend (e.g., pass) may be less than a light transmittance of other regions of the transmission area TA (e.g., that do not overlap with the second wirings WL2).

A plurality of first wirings WL1 may be arranged at (e.g., in or on) the display area DA, and may extend in the first direction DR1. The plurality of first wirings WL1 may be connected to the plurality of main pixels Pm, respectively. Unlike the plurality of second wirings WL2, the plurality of first wirings WL1 may not be connected to the plurality of auxiliary pixels Pa.

In the embodiment shown in FIG. 10, each of the plurality of first wirings WL1 may include an extension portion WL-C and a detouring portion WL-R. The extension portion WL-C may be arranged at (e.g., in or on) the display area DA, and the detouring portion WL-R may be arranged at (e.g., in or on) the second area A2 of the component area CA. In other words, at (e.g., in or on) the component area CA, the plurality of first wirings WL1 may be arranged to extend across (e.g., to pass across) only the second area A2, and to detour around the first area A1 at (e.g., in or on) the component area CA. As described above, because the transmission area TA may be arranged at (e.g., in or on) the first area A1, when the plurality of first wirings WL1 are arranged to extend across (e.g., to pass across) the first area A1 without the detouring portion WL-R, a light transmittance of the transmission area TA may be reduced by the plurality of first wirings WL1.

In comparison, in the display device 1 according to one or more example embodiments, the plurality of first wirings WL1 may be arranged at (e.g., in or on) the second area A2 to detour around the edge (e.g., the periphery) of the component area CA, and the plurality of first wirings WL1 may connect the plurality of main pixels Pm arranged in the first direction DR1 to each other with the component area CA therebetween. In this case, a signal or a power may be transferred (e.g., may be effectively transferred) to the plurality of main pixels Pm arranged at (e.g., in or on) the display area DA without a reduction or a substantial reduction of the light transmittance of the transmission area TA of the component area CA.

As shown in FIG. 10, the plurality of second wirings WL2 may extend in the first direction DR1, and may be located at (e.g., in or on) the second area A2. For example, in some embodiments, the plurality of second wirings WL2 may extend across (e.g., may pass across) the second area A2. As described above, to allow the plurality of first wirings WL1 to detour around the second area A2, the plurality of first wirings WL1 may be electrically insulated from some of the plurality of second wirings WL2 that extend across (e.g., that pass across) the second area A2.

Accordingly, the extension portion WL-C and the detouring portion WL-R of the plurality of first wirings WL1 may be arranged at (e.g., in or on) different layers from each other, and may be electrically connected to each other through a contact hole CNT. For example, as shown in FIG. 10, the contact hole CNT may be located at (e.g., in or on) the second area A2.

Figure 11:
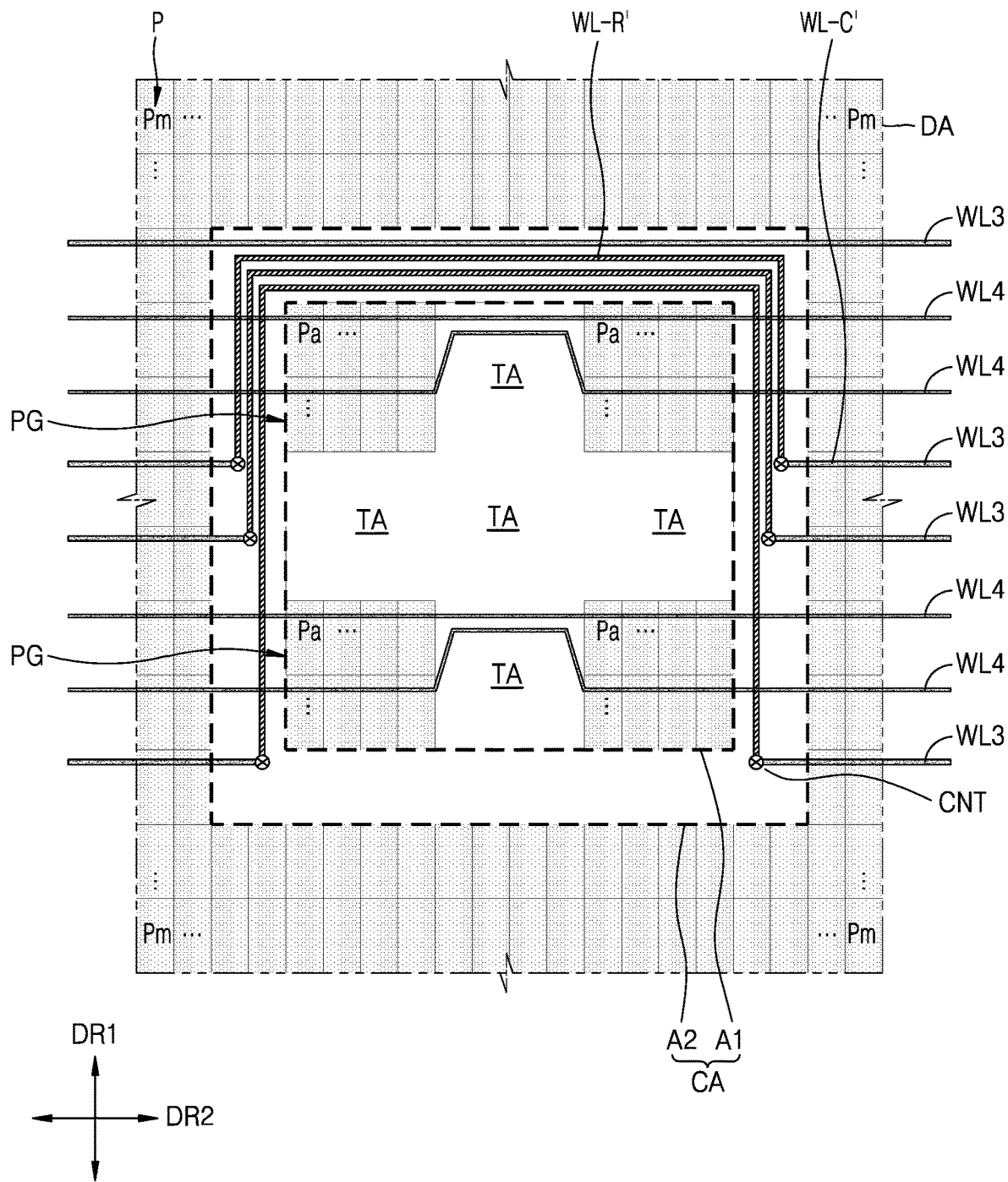
FIG. 11 is a plan view of an arrangement relation of a pixel and a wiring of a display device according to an embodiment.

FIG. 11 is a plan view of an arrangement relation of a pixel and a wiring of a display device according to an embodiment.

A structure of the embodiment shown in FIG. 11 may be the same or substantially the same as that of the embodiment shown in FIG. 7, except that in the embodiment of FIG. 11, a plurality of third wirings WL3 and a plurality of fourth wirings WL4 are shown, each extending in a second direction DR2 crossing the first direction DR1. In an embodiment, the plurality of third wirings WL3 and the plurality of fourth wirings WL4 may include (e.g., may define) a scan line (e.g., a plurality of scan lines) SL. In another embodiment, the plurality of third wirings WL3 and the plurality of fourth wirings WL4 may include (e.g., may define) an emission control line (e.g., a plurality of emission control lines) EL.

Referring to FIG. 11, the plurality of fourth wirings WL4 may be arranged at (e.g., in or on) the component area CA, and may extend in the second direction DR2. The plurality of fourth wirings WL4 may be connected to the plurality of auxiliary pixels Pa, respectively. Further, the plurality of fourth wirings WL4 may extend in the second direction DR2, and may also be connected to the plurality of main pixels Pm (e.g., from among the plurality of main pixels Pm that are arranged at a same row as those of the auxiliary pixels Pa).

The plurality of fourth wirings WL4 may extend in the second direction DR2, and may be arranged to extend across (e.g., to pass across) the transmission area TA. At (e.g., in or on) a region of the transmission area TA that overlaps with the plurality of fourth wirings WL4, the plurality of fourth wirings WL4 may be arranged to be biased on one side of the transmission area TA. A light transmittance of a portion of the transmission area TA across which the plurality of fourth wirings WL4 do not extend (e.g., do not pass) may be increased (e.g., may be remarkably raised) compared to a light transmittance of the region of the transmittance area TA that overlaps with the plurality of fourth wirings WL4.

The plurality of third wirings WL3 may be arranged at (e.g., in or on) the display area DA, and may extend in the second direction DR2. The plurality of third wirings WL3 may be connected to the plurality of main pixels Pm, respectively. Unlike the plurality of fourth wirings WL4, the plurality of third wirings WL3 may not be connected to the plurality of auxiliary pixels Pa.

In the embodiment shown in FIG. 11, the plurality of third wirings WL3 may include an extension portion WL-C' and a detouring portion WL-R'. The extension portion WL-C' may be arranged at (e.g., in or on) the display area DA, and the detouring portion WL-R' being arranged at (e.g., in or on) the second area A2 of the component area CA. In other words, at (e.g., in or on) the component area CA, the plurality of third wirings WL3 may be arranged to extend across (e.g., to pass across) only the second area A2, and to detour around the first area A1 at (e.g., in or on) the component area CA. As described above, because the transmission area TA may be arranged at (e.g., in or on) the first area A1, when the plurality of third wirings WL3 are arranged to extend across (e.g., to pass across) the first area A1 without the detouring portion WL-R', a light transmittance of the transmission area TA may be reduced by the plurality of third wirings WL3.

In comparison, in the display device 1 according to one or more example embodiments, the plurality of third wirings WL3 may be arranged at (e.g., in or on) the second area A2 to detour around the edge (e.g., the periphery) of the component area CA, and the plurality of third wirings WL3 may connect the plurality of main pixels Pm arranged in the second direction DR2 to each other with the component area CA therebetween. In this case, a signal or a power may be transferred (e.g., may be effectively transferred) to the plurality of main pixels Pm arranged at (e.g., in or on) the display area DA without a reduction or a substantially reduction of the light transmittance of the transmission area TA of the component area CA.

As shown in FIG. 11, the plurality of fourth wirings WL4 may extend in the second direction DR2, and may be arranged at (e.g., in or on) the second area A2. For example, in some embodiments, the plurality of fourth wirings WL4 may extend across (e.g., may pass across) the second area A2. As described above, to allow the plurality of third wirings WL3 to detour around the first area A1 on the second area A2, the plurality of third wirings WL3 may be electrically insulated from some of the plurality of fourth wirings WL4 that extend across (e.g., that pass across) the second area A2.

Therefore, the extension portion WL-C' and the detouring portion WL-R' of the plurality of third wirings WL3 may be arranged at (e.g., in or on) different layers from each other, and may be electrically connected to each other through a contact hole CNT. While FIG. 11 shows that the contact hole CNT may be located at (e.g., in or on) the second area A2, the present disclosure is not limited thereto. Similar to the embodiment shown in FIG. 9, the plurality of third wirings WL3 may include a fourth conductive layer and a fifth conductive layer. The fourth conductive layer may be electrically connected to the fifth conductive layer through a contact hole with an insulating layer therebetween.

While the display device has been mainly described according to one or more example embodiments of the present disclosure, the present disclosure is not limited thereto. For example, a method of manufacturing the display device according to one or more example embodiments of the present disclosure may also be within the spirit and scope of the present disclosure.

According to one or more example embodiments of the present disclosure, a display panel including an extended display area such that an image may be displayed even at (e.g., in or on) an area in which a component is arranged, and a display device including the display panel, may be implemented. However, the spirit and scope of the present disclosure is not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
a substrate comprising a component area, and a display area surrounding the component area, the component area comprising a first area, and a second area surrounding the first area;
a plurality of first display elements at the display area;
a plurality of pixel groups spaced from each other in an island shape at the first area, each of the plurality of pixel groups comprising a plurality of second display elements;
a plurality of transmission areas adjacent to the plurality of pixel groups at the first area; and
a plurality of first wirings extending in a first direction and electrically connected to the plurality of first display elements, the plurality of first wirings detouring around the first area at the second area.

2. The display panel of claim 1, wherein a resolution of the component area per unit area is ½ or less than a resolution of the display area per unit area.

3. The display panel of claim 1, further comprising a plurality of second wirings extending in the first direction and electrically connected to the plurality of second display elements, the plurality of second wirings overlapping with at least a portion of the plurality of transmission areas.

4. The display panel of claim 3, wherein the plurality of second wirings overlapping with the at least the portion of the plurality of transmission areas are biased on one side of the plurality of transmission areas.

5. The display panel of claim 4, wherein the plurality of first wirings and the plurality of second wirings are configured to transfer a data signal to the plurality of first display elements and the plurality of second display elements.

6. The display panel of claim 1, further comprising a plurality of third wirings extending in a second direction crossing the first direction, and detouring along an edge of the first area.

7. The display panel of claim 6, wherein the plurality of third wirings are configured to transfer a scan signal to the plurality of first display elements.

8. The display panel of claim 1, further comprising:
a first conductive layer on the substrate;
a second conductive layer on the first conductive layer;
a first insulating layer between the first conductive layer and the second conductive layer; and
a plurality of second wirings extending in the first direction and electrically connected to the plurality of second display elements, the plurality of second wirings overlapping with at least a portion of the plurality of transmission areas,
wherein the plurality of second wirings comprise the same material as that of the first conductive layer.

9. The display panel of claim 8, wherein each of the plurality of first wirings comprises an extension portion at the display area, and a detouring portion at the second area, and
the extension portion is connected to the detouring portion through a contact hole defined in the first insulating layer.

10. The display panel of claim 9, wherein the extension portion comprises the same material as that of the first conductive layer, and
the detouring portion comprises the same material as that of the second conductive layer.

11. The display panel of claim 8, wherein each of the plurality of second display elements is electrically connected to a pixel circuit comprising a thin film transistor and a storage capacitor,
the thin film transistor comprises a semiconductor layer, a gate electrode overlapping with the semiconductor layer, and an electrode layer connected to the semiconductor layer, and
the storage capacitor comprises a bottom electrode, and a top electrode overlapping with the bottom electrode, the gate electrode of the thin film transistor serving as the bottom electrode of the storage capacitor.

12. The display panel of claim 11, wherein the first conductive layer comprises the same material as that of the electrode layer.

13. The display panel of claim 11, wherein each of the plurality of second display elements comprises:
a pixel electrode;
an opposite electrode on the pixel electrode; and
an intermediate layer between the pixel electrode and the opposite electrode,
wherein the pixel circuit further comprises a contact metal layer connected to the electrode layer at a bottom portion thereof, and connected to the pixel electrode at a top portion thereof.

14. The display panel of claim 13, wherein the second conductive layer comprises the same material as that of the contact metal layer.

15. The display panel of claim 1, wherein some of the plurality of pixel groups are surrounded by the plurality of transmission areas.

16. The display panel of claim 1, wherein some of the plurality of pixel groups are surrounded by the plurality of transmission areas and the second area.

17. The display panel of claim 1, further comprising at least one insulating layer on the substrate,
wherein the at least one insulating layer has openings corresponding to the plurality of transmission areas, respectively.

18. The display panel of claim 1, wherein some of the plurality of first wirings detour around at least some of the plurality of pixel groups, and overlap with some of the plurality of transmission areas.

19. The display panel of claim 1, wherein a transmittance of the plurality of transmission areas is greater than a transmittance of the second area.

20. The display panel of claim 1, further comprising a plurality of metal layers at the component area,
wherein the plurality of metal layers correspond to the plurality of pixel groups, respectively.

21. The display panel of claim 20, wherein each of the plurality of second display elements is electrically connected to a thin film transistor comprising a semiconductor layer, and a gate electrode overlapping with the semiconductor layer, and
the plurality of metal layers are located between the substrate and the semiconductor layer.

22. A display device comprising:
a display panel comprising a substrate, the substrate comprising a component area, and a display area surrounding the component area, and the component area comprising a first area, and a second area surrounding the first area; and
an electronic element at the component area of the display panel,
wherein the display panel comprises:
a plurality of first display elements at the display area;
a plurality of pixel groups spaced from each other in an island shape at the first area, each of the plurality of pixel groups comprising a plurality of second display elements;
a plurality of transmission areas adjacent to the plurality of pixel groups at the first area; and
a plurality of first wirings extending in a first direction and electrically connected to the plurality of first display elements, the plurality of first wirings detouring around the first area at the second area.

23. The display device of claim 22, wherein the electronic element comprises an imaging element.

* * * * *